US011010969B1

(12) United States Patent
Li et al.

(10) Patent No.: US 11,010,969 B1
(45) Date of Patent: May 18, 2021

(54) GENERATION OF SUBSURFACE REPRESENTATIONS USING LAYER-SPACE

(71) Applicant: Chevron U.S.A. Inc., San Ramon, CA (US)

(72) Inventors: Lewis Li, Houston, TX (US); Tao Sun, Houston, TX (US); Sebastien B. Strebelle, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 0 days.

(21) Appl. No.: 16/706,602

(22) Filed: Dec. 6, 2019

(51) Int. Cl.
*G06T 15/00* (2011.01)
*G06T 17/20* (2006.01)

(52) U.S. Cl.
CPC .................. *G06T 17/20* (2013.01)

(58) Field of Classification Search
CPC ........... G01N 33/24; G01N 30/20; G01N 2203/0053; G01N 2203/0067; G01N 1/08; G01V 99/00; G01V 2210/6242; G06T 17/00
USPC ........................................... 345/418
See application file for complete search history.

(56) References Cited

U.S. PATENT DOCUMENTS

| | | |
|---|---|---|
| 2,653,220 A | 9/1953 | Bays |
| 7,079,953 B2 | 7/2006 | Thorne |
| 7,516,055 B2 | 4/2009 | Strebelle |
| 7,706,981 B2 | 4/2010 | Wilkinson |
| 8,271,244 B2 | 9/2012 | Ross |
| 8,666,149 B2 | 3/2014 | Thorne |
| 9,187,984 B2 | 11/2015 | Usadi |
| 9,753,180 B2 | 9/2017 | Suzuki |
| 9,804,282 B2 | 10/2017 | Xu |
| 10,036,829 B2 | 7/2018 | Ghayour |
| 10,190,403 B2 | 1/2019 | Samuel |

(Continued)

FOREIGN PATENT DOCUMENTS

| | | |
|---|---|---|
| CN | 102540256 | 7/2012 |
| CN | 103454678 | 12/2013 |

(Continued)

OTHER PUBLICATIONS

Rubio, R.H., Koppe, V.C., Costa, J.F.C.L. and Cherchenevski, P. K., 2015. How the use of stratigraphic coordinates improves grade estimation. Rem: Revista Escola de Minas, 68(4), pp. 471-477.*

(Continued)

*Primary Examiner* — Phu K Nguyen
(74) *Attorney, Agent, or Firm* — Esplin & Associates, PC

(57) ABSTRACT

Data in physical space may be converted to layer space before performing modeling to generate one or more subsurface representations. Computational stratigraphy model representations that define subsurface configurations as a function of depth in the physical space may be converted to the layer space so that the subsurface configurations are defined as a function of layers. Conditioning information that defines conditioning characteristics as the function of depth in the physical space may be converted to the layer space so that the conditioning characteristics are defined as the function of layers. Modeling may be performed in the layer space to generate subsurface representations within layer space, and the subsurface representations may be converted into the physical space.

20 Claims, 12 Drawing Sheets

(56) References Cited

U.S. PATENT DOCUMENTS

| | | | |
|---|---|---|---|
| 10,287,858 B2 * | 5/2019 | Ghayour | G01V 99/005 |
| 10,317,569 B2 * | 6/2019 | Sun | G01V 99/005 |
| 10,319,143 B2 | 6/2019 | Branets | |
| 10,365,261 B2 * | 7/2019 | Montgomery | G01N 33/24 |
| 10,816,440 B2 * | 10/2020 | Amendt | G01N 33/24 |
| 2002/0013687 A1 | 1/2002 | Ortoleva | |
| 2005/0180261 A1 | 8/2005 | Mandal | |
| 2006/0041409 A1 | 2/2006 | Strebelle | |
| 2007/0100593 A1 | 5/2007 | Deffenbaugh | |
| 2008/0015784 A1 | 1/2008 | Dorn | |
| 2009/0262603 A1 | 10/2009 | Hurley | |
| 2010/0149917 A1 | 6/2010 | Imhof | |
| 2010/0332205 A1 | 12/2010 | Tillier | |
| 2011/0002194 A1 | 1/2011 | Imhof | |
| 2011/0054857 A1 | 3/2011 | Moguchaya | |
| 2011/0213600 A1 | 9/2011 | Strebelle | |
| 2011/0231164 A1 | 9/2011 | Zhang | |
| 2011/0240310 A1 | 10/2011 | Sun | |
| 2011/0264430 A1 | 10/2011 | Tapscott | |
| 2012/0029828 A1 | 2/2012 | Pepper | |
| 2012/0221302 A1 | 8/2012 | Lewandowski | |
| 2012/0221306 A1 | 8/2012 | Hurley | |
| 2013/0064040 A1 | 3/2013 | Imhof | |
| 2013/0118736 A1 | 5/2013 | Usadi | |
| 2013/0151161 A1 | 6/2013 | Imhof | |
| 2013/0179080 A1 | 7/2013 | Skalinski | |
| 2013/0294197 A1 | 11/2013 | Vallikkat Thachaparambil | |
| 2013/0318141 A1 | 11/2013 | Maucec | |
| 2013/0329986 A1 | 12/2013 | Strebelle | |
| 2014/0035912 A1 | 2/2014 | Thorne | |
| 2014/0316706 A1 | 10/2014 | Grant | |
| 2014/0358440 A1 | 12/2014 | Pyrcz | |
| 2015/0066460 A1 | 3/2015 | Klinger | |
| 2015/0088424 A1 | 3/2015 | Burlakov | |
| 2015/0212231 A1 | 7/2015 | Borouchaki | |
| 2015/0219793 A1 | 8/2015 | Li | |
| 2015/0309197 A1 | 10/2015 | Dimitrov | |
| 2016/0041279 A1 | 2/2016 | Casey | |
| 2016/0048933 A1 | 2/2016 | Strebelle | |
| 2016/0103245 A1 | 4/2016 | Pyrcz | |
| 2016/0139299 A1 | 5/2016 | Leger | |
| 2016/0313463 A1 | 10/2016 | Wahrmund | |
| 2018/0003839 A1 | 1/2018 | Lowell | |
| 2018/0217283 A1 | 8/2018 | Klinger | |
| 2018/0225778 A1 | 8/2018 | Grant | |
| 2020/0380390 A1 | 12/2020 | Sun | |

FOREIGN PATENT DOCUMENTS

| | | |
|---|---|---|
| CN | 103454686 | 12/2013 |
| CN | 104111473 | 10/2014 |
| CN | 105372705 | 3/2016 |
| CN | 105717542 | 6/2016 |
| CN | 105954802 | 9/2016 |
| CN | 107942382 | 4/2018 |
| CN | 107976713 | 5/2018 |
| EP | 2917770 | 9/2015 |
| FR | 3039679 | 2/2017 |
| GB | 2474740 | 4/2011 |
| WO | 2017019718 | 2/2017 |

OTHER PUBLICATIONS

Santoshini S, Harris S, Kashem S, Levannier A, Benabbou A, Viard T, Macé L. Depogrid: Next Generation Unstructured Grids for Accurate Reservoir Modeling and Simulation. InSPE Russian Petroleum Technology Conference Oct. 1, 2018. Society of Petroleum Engineers.*

Harris S, Santoshini S, Kashem S, Viard T, Levannier A, Benabbou A. Complex geological modeling and quality assurance using unstructured grids. InAbu Dhabi International Petroleum Exhibition & Conference Nov. 12, 2018. Society of Petroleum Engineers.*

Hawie, Nicolas, Jacob Covault, Dallas Dunlap, and Zoltan Sylvester 2017. "Slope-fan Depositional Architecture from High-resolution Forward Stratigraphic Models". EarthArXiv. Dec. 19. eartharxiv.org/f9dkp. (36 pages).

Yupeng, Li, and Wu Shenghe. "Hierarchical nested simulation approach in reservoir architecture modeling." Petroleum Exploration and Development 40, No. 5 (2013): 676-681.

Sacchi, Quinto, Eloisa Salina Borello, Gert Jan Weltje, and Rory Dalman. "Increasing the predictive power of geostatistical reservoir models by integration of geological constraints from stratigraphic forward modeling." Marine and Petroleum Geology 69 (2016): 112-126.

Efros, A. A., & Freeman, W. T. (2001). Image quilting for texture synthesis and transfer. Proceedings of the 28th Annual Conference on Computer Graphics and Interactive Techniques—SIGGRAPH '01, 341-346. https://doi.org/10.1145/383259.383296.

Hoffimann, J., Scheidt, C., Barfod, A., & Caers, J. (2017). Stochastic simulation by image quilting of process-based geological models. Computers and Geosciences, 106(Feb.), 18-32. https://doi.org/10.1016/j.cageo.2017.05.012.

Mariethoz, G., Renard, P., & Straubhaar, J. (2010). The direct sampling method to perform multiple-point geostatistical simulations. Water Resources Research, 46(11). https://doi.org/10.1029/2008WR007621.

Mahmud, K., Mariethoz, G., Caers, J., Tahmasebi, P., & Baker, A. (2014). Simulation of Earth textures by conditional image quilting. Water Resources Research, 50(4), 3088-3107. https://doi.org/10.1002/2013WR015069.

Bertoncello, Antoine, Caers, Jef, Biver, Pierre, CaumonGuillaume, (2008). Geostatistics on Stratigraphic Grid. ERE department/Stanford University (pp. 1-16).

PCT International Search Report and Written Opinion, International Application No. PCT/US20/31869, dated Aug. 4, 2020. 2 pages.

Liu et al. "Visual Analytics of Stratigraphic Correlation for Multi-attribute Well-logging Data Exploration." Jul. 2019 IEEE Access PP(99):1-1, Jul. 16, 2019, [online] [retrieved on Oct. 5, 2020 (Oct. 5, 2020)) Retrieved from the Internet< URL: https://ieeexplore.ieee.org/document/8764395>. entire document (13 pages).

PCT International Search Report and Written Opinion, International Application No. PCT/US20/44874, dated Dec. 17, 2020. (8 pages).

PCT International Search Report and Written Opinion, International Application No. PCT/US20/61212, dated Dec. 21, 2020. (7 pages).

PCT International Search Report and Written Opinion, International Application No. PCT/US2020/61323, dated Feb. 19, 2021 (8 pages).

* cited by examiner

GENERATION OF SUBSURFACE REPRESENTATIONS USING LAYER-SPACE

FIELD

The present disclosure relates generally to the field of generating representations of subsurface using layer space.

BACKGROUND

Subsurface simulations face competing challenges of honoring conditioning subsurface characteristics versus maintaining subsurface realism. For example, simulations produced using Cartesian grids precludes modeling of small-scale continuous layers. Honoring conditioning subsurface characteristics may be difficult for process-based approaches.

SUMMARY

This disclosure relates to generating subsurface representations. Representation information, conditioning information, and/or other information may be obtained. The representation information may define one or more sets of computational stratigraphy model representations. The set(s) of computational stratigraphy model representations may define subsurface configurations in a physical space such that the subsurface configurations are defined as a function of spatial location (e.g., depth, lateral spatial location). The conditioning information may define one or more conditioning characteristics in the physical space such that the conditioning characteristic(s) are defined as the function of spatial location (e.g., depth, lateral spatial location). The set(s) of computational stratigraphy model representations may be converted from the physical space to a layer space such that the subsurface configurations are defined as a function of layers (and lateral spatial location). The conditioning information may be converted from the physical space to the layer space such that the conditioning characteristic(s) are defined as the function of layers (and lateral spatial location).

Modeling may be performed within the layer space based on the set(s) of computational stratigraphy model representations within the layer space, the conditioning characteristic(s) within the layer space, and/or other information to generate one or more subsurface representations within the layer space. The subsurface representation(s) may include regions of the subsurface configurations based on the conditioning characteristic(s) and/or other information. The subsurface representation(s) may be converted from the layer space to the physical space.

A system that generates subsurface representations may include one or more electronic storage, one or more processors and/or other components. The electronic storage may store representation information, information relating to subsurface representations, information relating to subsurface configurations, conditioning information, information relating to conditioning characteristics, information relating to physical space, information relating to layer space, information relating to conversion between physical space and layer space, information relating to modeling, and/or other information.

The processor(s) may be configured by machine-readable instructions. Executing the machine-readable instructions may cause the processor(s) to facilitate generating subsurface representations. The machine-readable instructions may include one or more computer program components. The computer program components may include one or more of a representation information component, a conditioning information component, a layer space component, a modeling component, a physical space component, and/or other computer program components.

The representation information component may be configured to obtain representation information and/or other information. The representation information may define one or more sets of computational stratigraphy model representations. A set of computational stratigraphy model representations may define subsurface configurations in a physical space such that the subsurface configurations are defined as a function of spatial location (e.g., depth, x-y coordinate in map view).

The conditioning information component may be configured to obtain conditioning information and/or other information. The conditioning information (e.g., geological data, petrophysical data, geophysical data, seismic data) may define one or more conditioning characteristics in the physical space such that the conditioning characteristic(s) are defined as the function of spatial location (e.g., depth, x-y coordinate in map view). In some implementations, the conditioning characteristic(s) may be determined based on one or more well logs, interpreted seismic information, and/or other information.

The layer space component may be configured to convert the conditioning information from the physical space to a layer space such that the conditioning characteristic(s) are defined as a function of layers. The layer space component may be configured to convert the set(s) of computational stratigraphy model representations from the physical space to the layer space such that the subsurface configurations are defined as the function of layers.

In some implementations, the set(s) of computational stratigraphy model representations in the layer space may define the subsurface configurations using cells within individual computational stratigraphy model grid layers. The cells may be characterized by a cell thickness, one or more properties of interest, and/or other information. In some implementations, the propert(ies) of interest may include a grain size, a grain type, a grain lithology, a porosity, a permeability, and/or other propert(ies).

The modeling component may be configured to perform modeling within the layer space based on the set(s) of computational stratigraphy model representations within the layer space, the conditioning characteristic(s) within the layer space, and/or other information to generate one or more subsurface representations within the layer space. The subsurface representation(s) may include regions of the subsurface configurations based on the conditioning characteristic(s) and/or other information.

In some implementations, the modeling may be performed using a multi-point statistics technique and/or other techniques. In some implementations, the set(s) of computational stratigraphy model representations may be used as a set of training images in the multi-point statistics technique.

In some implementations, performance of the modeling may include, for an individual subsurface representation, generation of a simulation domain to define one or more properties of interest and a cell thickness for individual cells. The simulation domain may be populated with the conditioning characteristic(s). The simulation domain may be partitioned into tiles, with individual tiles having a core region and a peripheral region. At least some of the peripheral region of an individual tile may overlap with the core region of a neighboring tile. The tiles may include a set of partially populated tiles and a set of unpopulated tiles. The set of partially populated tiles may include one or more partially populated tiles populated with at least one of the conditioning characteristic(s). The set of unpopulated tiles may include one or more unpopulated tiles not populated with any of the conditioning characteristic(s).

Individual populated tiles may be filled based on partially populated tile matching regions of the subsurface configurations and/or other information. The partially populated tile matching regions may be determined based on matching with the conditioning characteristic(s) within the individual partially populated tiles and/or other information. Individual unpopulated tiles may be filled based on unpopulated tile matching regions of the subsurface configurations and/or other information. The unpopulated tile matching regions may be determined based on continuity with one or more neighboring tiles and/or other information. The individual partially populated tiles may be filled prior to filling of the individual unpopulated tiles.

In some implementations, the partially populated tile matching regions may be determined further based on a continuity score between a search template in the layer space and a computational stratigraphy model representation in the layer space. An order in which the individual unpopulated tiles are filled may be determined based on a raster path and/or other information. The raster path may prioritize in the order the unpopulated tiles adjacent to one or more of populated tiles over the unpopulated tiles not adjacent to any of the populated tiles.

The physical space component may be configured to convert the subsurface representation(s) from the layer space to the physical space. In some implementations, the subsurface representation(s) may model small-scale continuous layers and maintain physically plausible continuities of the set(s) of computational stratigraphy model representations, while jointly honoring the conditioning characteristic(s).

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a," "an," and "the" include plural referents unless the context clearly dictates otherwise.

DETAILED DESCRIPTION

The present disclosure relates to generating subsurface representations. Data in physical space may be converted to layer space before performing modeling to generate one or more subsurface representations. Computational stratigraphy model representations that define subsurface configurations as a function of depth (and lateral spatial location) in the physical space may be converted to the layer space so that the subsurface configurations are defined as a function of layers (and lateral spatial location). Conditioning information that defines conditioning characteristics as the function of depth (and lateral spatial location) in the physical space may be converted to the layer space so that the conditioning characteristics are defined as the function of layers (and lateral spatial location). Modeling may be performed in the layer space to generate subsurface representations within layer space, and the subsurface representations may be converted into the physical space. Such subsurface representations may model small-scale continuous layers and maintain physically plausible continuities of the computational stratigraphy model representations, while jointly honoring the conditioning characteristics.

Figure 1:
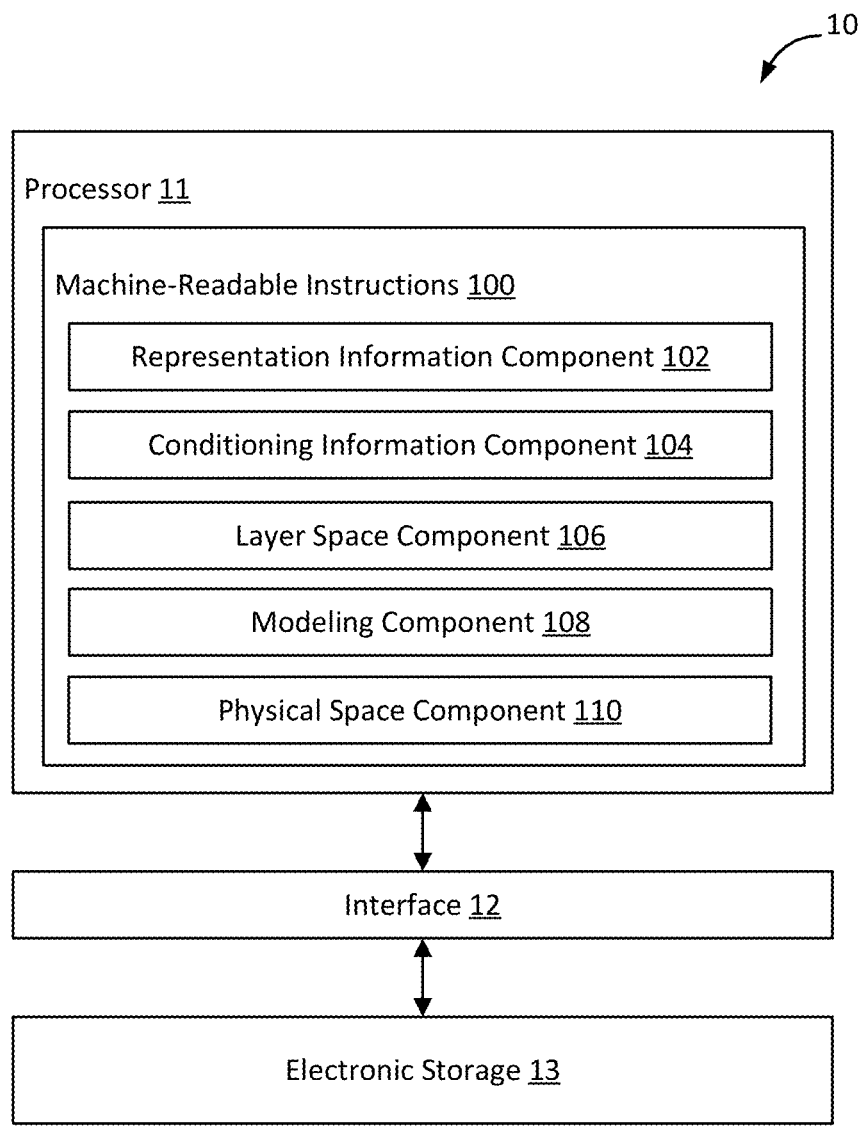
FIG. 1 illustrates an example system that generates subsurface representations.

The methods and systems of the present disclosure may be implemented by and/or in a computing system, such as a system 10 shown in FIG. 1. The system 10 may include one or more of a processor 11, an interface 12 (e.g., bus, wireless interface), an electronic storage 13, and/or other components. Representation information, conditioning information, and/or other information may be obtained by the processor 11. The representation information may define one or more sets of computational stratigraphy model representations. The set(s) of computational stratigraphy model representations may define subsurface configurations in the physical space such that the subsurface configurations are defined as a function of depth (and lateral spatial location). The conditioning information may define one or more conditioning characteristics in the physical space such that the conditioning characteristic(s) are defined as the function of depth (and lateral spatial location). The set(s) of computational stratigraphy model representations may be converted by the processor 11 from the physical space to the layer space such that the subsurface configurations are defined as a function of layers (and lateral spatial location). The conditioning information may be converted by the processor 11 from the physical space to the layer space such that the conditioning characteristic(s) are defined as the function of layers (and lateral spatial location).

Modeling may be performed by the processor 11 within the layer space based on the set(s) of computational stratigraphy model representations within the layer space, the conditioning characteristic(s) within the layer space, and/or other information to generate one or more subsurface representations within the layer space. The subsurface representation(s) may include regions of the subsurface configurations based on the conditioning characteristic(s) and/or other information. The subsurface representation(s) may be converted by the processor 11 from the layer space to the physical space.

Modeling may be used to generate subsurface representations. For example, modeling may be used to generate subsurface representations of reservoirs (e.g., 2D/3D reservoir models) conditioned to subsurface characteristics (e.g., of one or more wells) on stratigraphic grids. Increasing performance of modeling require continuous properties modeled on stratigraphic grids while retaining subsurface features with long range continuities.

A significant technological challenge in generating subsurface representations is capturing heterogeneity features that have great impact on the subsurface flow. An important geologic features that often defines the reservoir heterogeneity is low permeability layers sandwiched between high permeability layers. These low permeability layers are often layers of shale and mud deposits, or poorly sorted sedimentary beds such as hybrid beds. Although most of these low permeability layers are thin, they are often spatially continuous. It is precisely because of its spatial continuities, these low permeability layers can separate and partition the high permeability layers such as well sorted sand layers, to multiple disconnected compartments that prevent liquids in the reservoir to flow freely. While smaller patches of low permeability layers may not be able to functions as flow barriers that completely separate high perm layers to multiple compartments, they may function as flow baffles that can significantly alter the flow pathways, and for example, can have significant impact on the sweep efficiencies and recoveries in oil and gas reservoirs.

These important heterogeneity features in natural sedimentary systems may be mostly layers of mud and shale deposits in natural geologic systems. Within the scale of a water, oil or/and gas reservoirs, these layers are often thin and not volumetrically significant. However, because of their significance to the overall reservoir heterogeneity, these features must be captured and modeled accurately for the subsurface representation to be representative of the natural geologic systems for practical applications. For example, in oil and gas industry, the accuracy of subsurface representations in terms of how closely they represent the actual reservoir may directly impact the how accurately one can make the reservoir production performance predictions, and subsequently, may directly impact many related business decisions.

Accurately modeling these thin but spatially continuous layers represents a major challenge to the existing subsurface modeling technologies. Existing geologic modeling technologies may build subsurface representations with a predefined Cartesian grid in real space. Then a variety of geostatistical methods may be used to populate the properties, such as porosity, permeability, etc., to cells on the grid.

While existing geologic modeling technologies have had a variety of success in reproducing the rock types, rock properties and their spatial distributions in terms of their bulk volumes, reproducing the above mentioned spatially continuous, but volumetrically insignificant rock and sedimentary facies realistically remains a challenge. The reason being that the existing geostatistical models reproduce spatial continuities and connectivity through creating volumes of the similar types of rocks, while for thin shale and mud layers, their volumetric insignificance prevents their inclusion in modeling.

Computational stratigraphy modeling may be used to build subsurface representations. Rather than focusing on the final geometries of sedimentary bodies, and their spatial arrangement and distributions directly, computational stratigraphy may model the geologic systems/reservoirs by reproducing the processes of the formation of the natural geologic systems/reservoirs based on the fundamental physics of water flow, sediment transport, and other physics that governs the formation and evolution of that geological system/reservoir. By realistically reproduce the physical processes, the geometries of the resulting sedimentary bodies, their spatial distributions and arrangement may be reproduced automatically and naturally. These reproduced features may also include the thin and continuous shale and mud layers.

However, it may be challenging to use computational stratigraphy models to honor wells and other conditioning characteristics from a specific field in its applications to a specific field because not all the boundary conditions that defines a specific realizations of a specific computational stratigraphy model runs may be known. Therefore, honoring conditioning characteristics (e.g. conditioning to well data, seismic data, and other data obtained from a specific field) may be difficult for computational stratigraphy models or any other similar process-based modeling technologies.

For example, existing modeling techniques may generate models (e.g., 2D/3D representations) using training images. However, existing modeling techniques may be limited to modeling discrete subsurface properties (facies) on Cartesian grids using simple training images. Existing modeling techniques may not be able to apply geostatistics on stratigraphic grids while successfully retaining subsurface features. For example, existing modeling techniques may not be applied on stratigraphic grids required to capture thin layer features, which may have dramatic impact on the performance of the model.

For instance, the spatial distribution of petrophysical properties and large-scale connectivity may be critical in determining the performance of oil and gas reservoirs. Existing techniques to generate stochastic representations of subsurface properties face competing challenges of honoring conditioning characteristics versus maintaining subsurface realism. Geostatistical methods that can honor conditioning characteristics (hard/observed data) may not be able to generate realistic representations. Moreover, subsurface representations produced using Cartesian grids may preclude modeling of small-scale heterogeneities, such as thin shale layers. On the other hand, process-based techniques may be used to generate realistic representations on stratigraphic grids that contain small scale heterogeneities. However, honoring conditioning characteristics may be difficult due to the unknown initial and boundary conditions.

Figure 3:
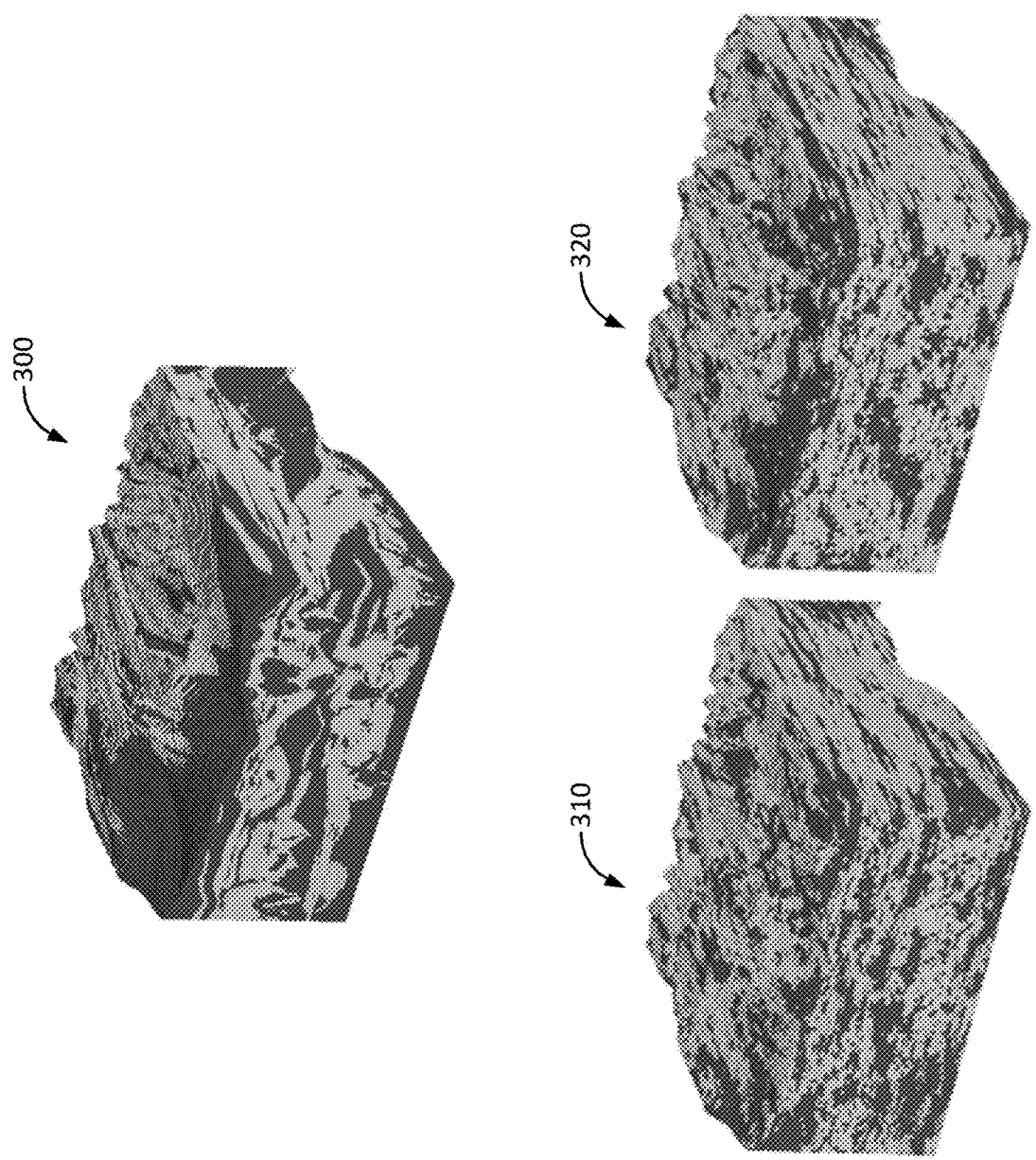
FIG. 3 illustrates an example computational stratigraphy model representation and example subsurface representations in the physical space.

For example, FIG. 3 illustrates an example computational stratigraphy model representation 300. The computational stratigraphy model representation 300 may define subsurface configurations in the physical space. The computational stratigraphy model representation 300 may be used as a training image (training data) for modeling to generate subsurface representations 310, 320 in the physical space. As shown in FIG. 3, the subsurface representations 310, 320 may be poor representations of a subsurface region. The subsurface representations 310, 320 may be noisy and unstructured compared to the computational stratigraphy model representation 300. The subsurface representations 310, 320 may not include small features, such as thin continuous layers.

To overcome such deficiencies, the methods and systems of the present disclosure may perform modeling within the layer space, rather than the physical space, to generate subsurface representations. While information in the physical space may be defined as a function of depth, information in the layer space may be defined as a function of layers. Computational stratigraphy model representations and conditioning characteristic(s) in the physical space may be converted to the layer space before performing modeling to generate subsurface representations that are both statistically representative as well as physically realistic. Computations of modeling, such as construction and pattern matching, may be performed in the layer space, and subsequently subsurface representations may be converted from the layer space to the physical space.

The methods and systems of the present disclosure enable direct simulation of the stratigraphic grids, population of the stratigraphic grids with conditioning characteristics, and generation of subsurface representations that model small-scale continuous layers and maintain physically plausible continuities specified in computational stratigraphy model representations, while jointly honoring conditioning characteristics. The methods and systems of the present disclosure solves the challenge of generating representations on non-Cartesian grids by directly simulating the grid itself, and by simultaneously populating the grid with the appropriate properties of interest (e.g., reservoir property) while maintaining the physically plausible continuities specified in the computational stratigraphy model representation and honoring conditioning characteristics (e.g., observed data).

Referring back to FIG. 1, the electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store representation information, information relating to subsurface representations, information relating to subsurface configurations, conditioning information, information relating to conditioning characteristics, information relating to physical space, information relating to layer space, information relating to conversion between physical space and layer space, information relating to modeling, and/or other information.

The processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate generating subsurface representations. The machine-readable instructions 100 may include one or more computer program components. The machine-readable instructions 100 may include one or more of a representation information component 102, a conditioning information component 104, a layer space component 106, a modeling component 108, a physical space component 110, and/or other computer program components.

The representation information component 102 may be configured to obtain representation information and/or other information. Obtaining representation information may include one or more of accessing, acquiring, analyzing, determining, examining, identifying, loading, locating, opening, receiving, retrieving, reviewing, selecting, storing, utilizing, and/or otherwise obtaining the representation information. The representation information component 102 may obtain representation information from one or more locations. For example, the representation information component 102 may obtain representation information from a storage location, such as the electronic storage 13, electronic storage of a device accessible via a network, and/or other locations. The representation information component 102 may obtain representation information from one or more hardware components (e.g., a computing device, a component of a computing device) and/or one or more software components (e.g., software running on a computing device). Representation information may be stored within a single file or multiple files.

The representation information may define one or more sets of subsurface representations. A set of subsurface representations may include one or more subsurface representations. A subsurface representation may refer to a computer-generated representation of a subsurface region, such as a one-dimensional, two-dimensional and/or three-dimensional model of the subsurface region. A subsurface representation may be defined by and/or include the subsurface configurations simulated by one or more subsurface models. A subsurface representation may be used as and/or may be referred to as a digital analog.

A subsurface region may refer to a part of earth located beneath the surface/located underground. A subsurface region may refer to a part of earth that is not exposed at the surface of the ground. A subsurface region may be defined in a single dimension (e.g., a point, a line) or in multiple dimensions (e.g., a surface, a volume). A subsurface region may include a physical subsurface region, such as a region in the real world, or a virtual subsurface region, such as a subsurface representation generated/simulated using one or more computer models (e.g., computational stratigraphy models).

A subsurface model may refer to a computer model (e.g., program, tool, script, function, process, algorithm) that generates subsurface representations. A subsurface model may simulate one or more subsurface configurations within a region underneath the surface (subsurface region). A subsurface model may simulate subsurface configurations by generating one or more subsurface representations. A subsurface configuration may refer to attribute, quality, and/or characteristics of a subsurface region. A subsurface configuration may refer to physical arrangement of materials (e.g., subsurface elements) within a subsurface region. Examples of subsurface configurations simulated by a subsurface model may include types of subsurface materials, characteristics of subsurface materials, compositions of subsurface materials, arrangements/configurations of subsurface materials, physics of subsurface materials, and/or other subsurface configurations. For instance, a subsurface configuration may include and/or define types, shapes, and/or properties of materials and/or layers that form subsurface (e.g., geological, petrophysical, geophysical, stratigraphic) structures.

An example of a subsurface model is a computational stratigraphy model. A computational stratigraphy model may refer to a computer model that simulates depositional and/or stratigraphic processes on a grain size scale while honoring physics-based flow dynamics. A computational stratigraphy model may simulate rock properties, such as velocity and density, based on rock-physics equations and assumptions. Input to a computational stratigraphy model may include information relating to a subsurface region to be simulated. For example, input to a computational stratigraphy model may include paleo basin floor topography, paleo flow and sediment inputs to the basin, and/or other information relating to the basin. In some implementations, input to a computational stratigraphy model may include one or more paleo geologic controls, such as climate changes, sea level changes, tectonics and other allocyclic controls. Output of a computational stratigraphy model may include one or more subsurface configurations and/or one or more subsurface representations. A subsurface representation generated by a computational stratigraphy model may be referred to as a computational stratigraphy model representation.

A computational stratigraphy model may include a forward stratigraphic model. A forward stratigraphic model may be fully based on physics of flow and sediment transport. A forward stratigraphic model may simulate one or more sedimentary processes that recreate the way stratigraphic successions develop and/or are preserved. The forward stratigraphic model may be used to numerically reproduce the physical processes that eroded, transported, deposited and/or modified the sediments over variable time periods. In a forward modelling approach, data may not be used as the anchor points for facies interpolation or extrapolation. Rather, data may be used to test and validate the results of the simulation. Stratigraphic forward modelling may be an iterative approach, where input parameters have to be modified until the results are validated by actual data. Usage of other subsurface models and other subsurface representations are contemplated.

A subsurface representation (e.g., computational stratigraphy model representation) may define one or more subsurface configurations. A subsurface representation may define subsurface configuration(s) in the physical space such that the subsurface configurations are defined as a function of spatial location. A subsurface representation may define subsurface configuration(s) in the physical space such that the subsurface configurations are defined as a function of vertical spatial location (e.g., depth), lateral spatial location (e.g., x-y coordinate in map view), and/or other spatial location. For example, a subsurface representation may define different types, shapes, and/or properties of materials and/or layers as a function of depth into the ground and as a function of lateral spatial location. The subsurface configurations defined as the function of spatial location may simulate the subsurface configurations that would be seen within a volume (e.g., well, reservoir) in the ground. For example, for a given x-y location, the subsurface configuration (e.g., arrangements of subsurface materials and associated properties) may be defined as a function of depth.

A subsurface representation may be representative of a subsurface region of interest. For example, the subsurface configurations defined by a subsurface representation may be representative of the subsurface configurations of a reservoir from which it is desired to generate simulate other subsurface configurations and/or generate other subsurface representations. Other types of subsurface settings are contemplated.

The conditioning information component 104 may be configured to obtain conditioning information and/or other information. Obtaining conditioning information may include one or more of accessing, acquiring, analyzing, determining, examining, identifying, loading, locating, opening, receiving, retrieving, reviewing, selecting, storing, utilizing, and/or otherwise obtaining the conditioning information. The conditioning information component 104 may obtain conditioning information from one or more locations. For example, the conditioning information component 104 may obtain conditioning information from a storage location, such as the electronic storage 13, electronic storage of a device accessible via a network, and/or other locations. The conditioning information component 104 may obtain conditioning information from one or more hardware components (e.g., a computing device, a component of a computing device) and/or one or more software components (e.g., software running on a computing device). Conditioning information may be stored within a single file or multiple files.

The conditioning information may define one or more conditioning characteristics. Conditioning characteristics may refer to subsurface feature, quantity, and/or quality that is desired to be preserved within subsurface representations. For example, conditioning characteristics may refer to geological characteristics, geophysical characteristics, and/or other subsurface characteristics. Conditioning characteristics may define the guide(s) and/or the fixed point(s) in generating subsurface representations. Conditioning characteristics may include subsurface feature, quantity, and/or quality of one or more subsurface points, areas, and/or volumes of interest. Conditioning characteristics may be referred to as hard data or fixed data. In some implementations, conditioning information may include geological data, petrophysical data, geophysical data, seismic data, and/or other subsurface data (from one or more locations/paths). For example, conditioning characteristics may include/reflect the characteristics at one or multiple geographical locations and/or along one or multiple specific paths.

For example, conditioning characteristics may include one or more rock properties (e.g., rock types, layers, grain sizes, porosity, permeability) that are to be preserved within subsurface representations and/or to be used as guides in generating subsurface representations. The rock properties may define fixed points from which subsurface representations are generated. Usage of other subsurface properties as condition characteristics are contemplated.

The conditioning information may define one or more conditioning characteristics in the physical space such that the conditioning characteristic(s) are defined as the function of spatial location. The conditioning information may define conditioning characteristic(s) in the physical space such that the conditioning characteristics are defined as a function of vertical spatial location (e.g., depth), lateral spatial location (e.g., x-y coordinate in map view), and/or other spatial locations. For example, the conditioning information may define different types, shapes, and/or properties of materials and/or layers as a function of depth at one or more locations (e.g., one or more wells).

In some implementations, the conditioning information may be determined based on one or more well logs, interpreted seismic information (including data or data sets), and/or other information. For example, the conditioning information may include information obtained from borehole logging of the well and may include a record of geologic formations penetrated by a borehole (e.g., geologic formations within/surrounding the well). As another example, the conditioning information may include information obtained from well cores (e.g., rock samples collected as part of drilling process) and/or other seismic information. The well cores/seismic information may provide information on one or more properties of the drilled rocks, such as rock types, layers, grain sizes, porosity, and/or permeability. For example, conditioning characteristics may include and/or may be determined based on rock types, layers, grain sizes, porosity, and/or permeability of one or more wells of interest. For multiple wells, the conditioning information may define relative positions/orientations of the wells, such as distance between wells and direction of a well from another well.

The layer space component 106 may be configured to convert subsurface data from the physical space to the layer space. Subsurface data may refer to data relating to one or more subsurface regions. A subsurface data may refer to data relating to physical subsurface region(s) and/or virtual subsurface region(s). The layer space component 106 may convert subsurface data from the physical space to the layer space before the subsurface data is used in modeling to generate subsurface representations. Conversion of subsurface data from the physical space to the layer space may include change in the vertical dimension used to define the subsurface data. Conversion of subsurface data from the physical space to the layer space may include change in the vertical dimension from depth (distance) into layers. The lateral dimensions of the subsurface data may not be changed by the conversion of the subsurface data between the physical space and the layer space.

Subsurface data in the physical space may provide and/or define information as a function of depth into the ground. For example, subsurface data in the physical space may define different types, shapes, and/or properties of materials and/or layers as a function of depth into the ground. Subsurface data in the layer space may provide and/or define information as a function of layers (e.g., rock layers) rather than as a function of depth. For example, subsurface data in the layer space may define different types, shapes, and/or properties of materials a function of layers in the ground. For instance, the subsurface data in the layer space may define thickness of layers (e.g., thickness of sedimentary rock) and other layer properties of interest as a function of layer (and the lateral spatial location). For example, the subsurface data in the layer space may define the thickness of sedimentary rock and other rock properties for different layers at any x-y location.

For example, the layer space component 106 may be configured to convert the conditioning information from the physical space to a layer space. Conditioning information that defines conditioning characteristic(s) as the function of depth in physical space may be converted to the layer space such that the conditioning characteristic(s) are defined as the function of layer.

As another example, the layer space component 106 may be configured to convert the set(s) of subsurface representations (e.g., computational stratigraphy model representations) from the physical space to the layer space. Subsurface representations that define subsurface configurations as a function of depth in the physical space may be converted to the layer space such that the subsurface configurations are defined as a function of layer. Information on generation of a subsurface representation (e.g., layer-by-layer building based on deposition times by a subsurface model) may be used to convert the subsurface representation from the physical space to the layer space. Thus, conversion of subsurface data from the physical space to the layer space may not include a straight conversion of depth to layer. Rather, conversion of subsurface data from the physical space to the layer space may group subsurface data based on being located within the same layer. Conversion of other subsurface data are contemplated.

Figure 4:
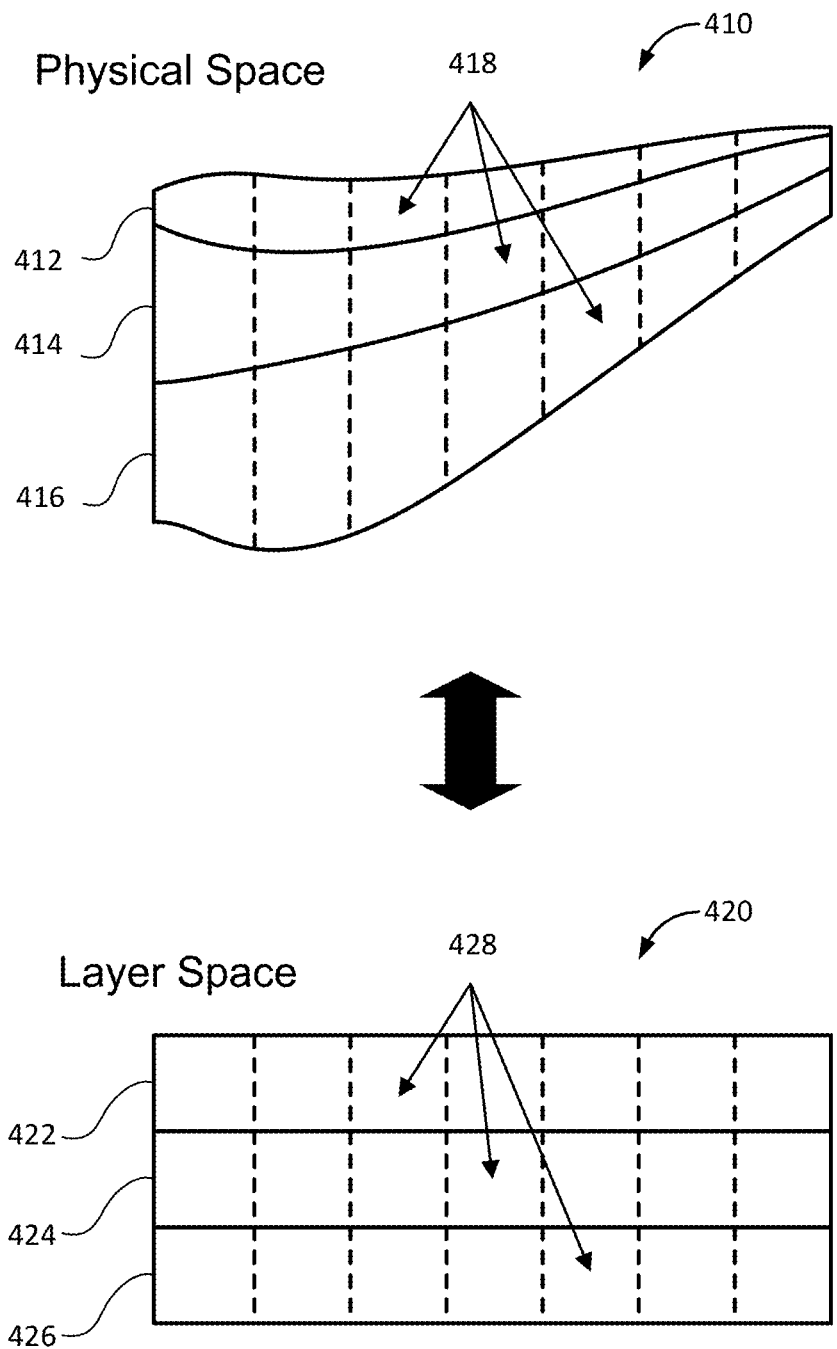
FIG. 4 illustrates an example conversion of subsurface data between the physical space and the layer space.

FIG. 4 illustrates an example conversion of subsurface data between the physical space and the layer space. FIG. 4 includes a physical space representation 410 of a subsurface region in the physical space and a layer space representation 420 of the subsurface region in the layer space. The vertical dimension of the physical space representation 410 in the physical space may be depth (distance). In the physical space representation 410, the subsurface configurations of the subsurface region may be defined as a function of depth under the ground. The subsurface region in the physical space may include layers 412, 414, 416. The layers 412, 414, 416 may include rocks layers that are arranged on top of one another. The layers 412, 414, 416 may have been deposited at different times. The layers 412, 414, 416 may be divided into cells 418.

The vertical dimension of the layer space representation 420 of subsurface region in the layer space may be layers. In the layer space representation 420, the subsurface configurations of the subsurface region may be defined as a function of layer, instead of depth. The layer space representation 420 may include the subsurface region divided/separated in area-layer rather than area-depth as shown in the physical space representation 410.

The subsurface region in the layer space may include layers 422, 424, 426 (e.g., computational stratigraphy model grid layers). The layers 422, 424, 426 may be divided into cells 428. The layer 422 may correspond to the layer 412, the layer 424 may correspond to the layer 414, and the layer 426 may correspond to the layer 416. Individual cells 428 may correspond to individual cells 418. Conversion of the subsurface region from the physical space to the layer space may result in layers of differing thicknesses and shapes being represented by uniform layers. For example, the upper right cell in the physical space representation 410 of the subsurface region may be thin/small and computations of subsurface data associated with such thin/small portions may be difficult. The corresponding upper right cell in the layer space representation 420 is larger, making the computation becomes easier to perform in the layer space compared to in the physical space. Thus, conversion of the subsurface data from the physical space to the layer space may facilitate modeling to generate subsurface representations. Conversion of the subsurface representation from the layer space to the physical space may result in the subsurface representation simulating how the corresponding subsurface region would appear in the real world.

In some implementations, one or more computational stratigraphy model representations in the layer space may define the subsurface configurations using cells within individual computational stratigraphy model grid layers. A cell within individual computational stratigraphy model grid layer may be used to convey information relating to the corresponding portion of the subsurface configurations. For example, the cells may be characterized by a cell thickness, one or more properties of interest, and/or other information. In some implementations, the propert(ies) of interest may include a grain size, a grain type, a grain lithology, a porosity, a permeability, and/or other propert(ies). In some implementations, the propert(ies) of interest may include one or more geological, petrophysical, geophysical, and/or stratigraphic properties.

Figure 5:
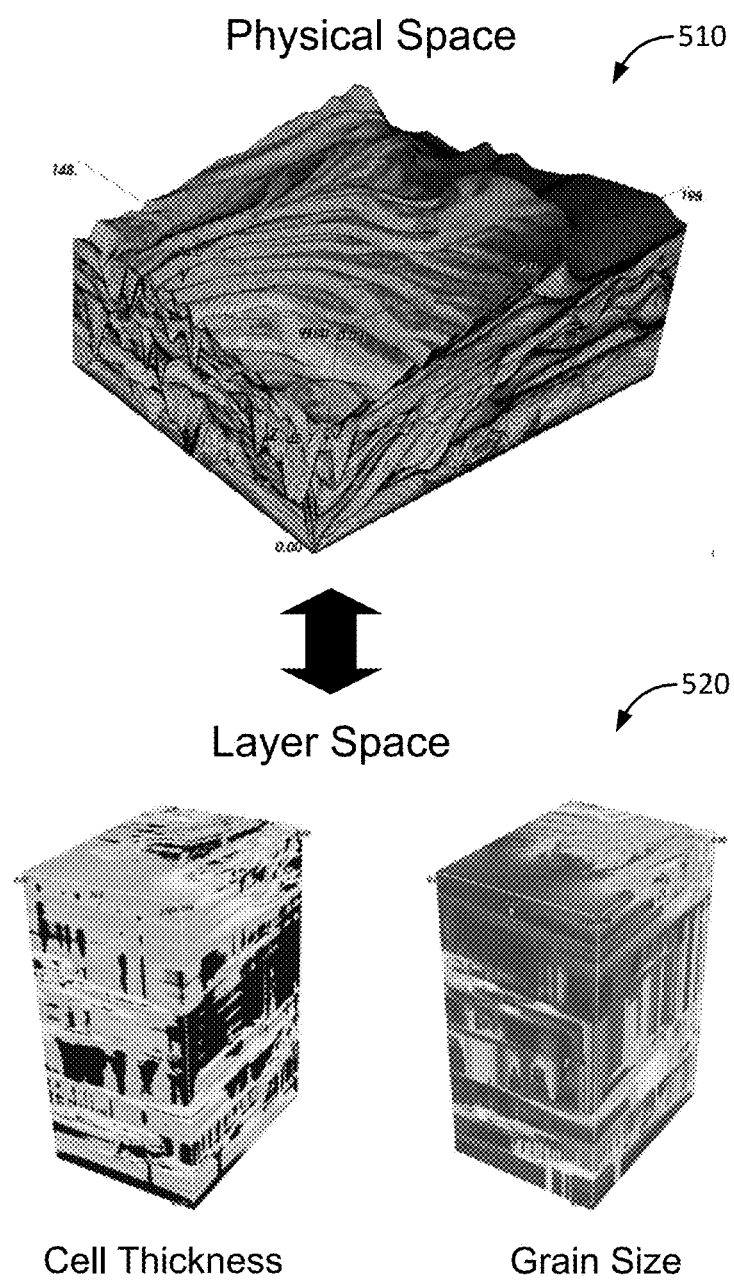
FIG. 5 illustrates an example conversion of a computational stratigraphy model representation between the physical space and the layer space.

FIG. 5 illustrates an example conversion of a subsurface representation (digital analog) between the physical space and the layer space. FIG. 5 includes a physical space representation 510 of a computational stratigraphy model representation in the physical space and a layer space representation 520 of the computational stratigraphy model representation in the layer space. The vertical dimension of the physical space representation 510 of the computational stratigraphy model representation in the physical space may be depth (distance) and the vertical dimension of the layer space representation 520 of the computational stratigraphy model representation in the layer space may be layers. The physical space representation 510 and/or the layer space representation 520 may be divided into cells.

The layer space representation 520 of the computational stratigraphy model representation in the layer space may include multiple representations to define different properties of the computational stratigraphy model representation. For a given computational stratigraphy model representation (denoted by superscript DA), conversion into the layer space may result in representations that define stratigraphic cell thicknesses and the corresponding subsurface properties of interest for individual cells $\{V_1^{DA}, V_2^{DA}, \ldots, V_{n_p}^{DA}\}$. For example, as shown in FIG. 5, layer space representation 520 of the computational stratigraphy model representation in the layer space may include a representation of cell thickness and a representation of grain size. Representations for other properties of interest (e.g., porosity, permeability) are contemplated.

The computational stratigraphy model representation in the physical space may not perform well as training images in modeling due to non-uniform cell thicknesses. Conversion of the computational stratigraphy model representation from the physical space to the layer space may result in layers of differing thicknesses and shapes being represented by uniform layers. Thus, conversion of the computational stratigraphy model representation from the physical space to the layer space may facilitate modeling to generate subsurface representations. Conversion of the computational stratigraphy model representation from the layer space to the physical space may result in the computational stratigraphy model representation simulating how the corresponding subsurface region (e.g., subsurface configurations of the subsurface region) would appear in the real world.

The modeling component 108 may be configured to perform modeling within the layer space based on subsurface data in the layer space and/or other information. The modeling may be performed to generate one or more subsurface representations. For example, modeling component 108 may be configured to perform modeling within the layer space based the set(s) of subsurface representations (e.g., computational stratigraphy model representation) within the layer space, the conditioning characteristic(s) within the layer space, and/or other information to generate one or more subsurface representations within the layer space. The modeling component 108 may use the subsurface configurations and conditioning characteristics defined as a function of layer (and as a function of lateral spatial location) to generate subsurface representation within the layer space. The modeling component 108 may use conditioning characteristics to determine which portions of the subsurface configurations will be included within the subsurface representation.

Modeling may refer to simulation of subsurface configurations using one or more subsurface models to building probable/equiprobable subsurface representations. The subsurface representation may be generated for a particular subsurface region, for a particular moment in time, and/or for a duration of time (e.g., simulation of how subsurface configurations change within a subsurface region over time). Modeling may generate one or more detailed subsurface representations using sparse data (e.g., conditioning characteristic(s) from well log(s)/well core(s)) and information relating to depositional systems (e.g., computational stratigraphy model representation(s)) to estimate subsurface characteristics (e.g., around well(s) and/or between wells). For example, modeling may be used to generate one or more subsurface representations of a reservoir based on conditioning characteristics from one or more wells of interest. Modeling (e.g., geostatistical modeling, stochastic simulation) may generate subsurface representation(s) by populating values for different portions/aspects of the subsurface representation(s). For example, modeling may be performed to populate the properties associated with each location on individual layer surfaces. The properties may include layer thickness. The properties may include other subsurface properties, such mean grain size for the deposited sediments, sorting of the grain size distribution of the deposited sediments, porosity and permeability, and/or other subsurface properties.

Performing modeling within the layer space may facilitate generation of subsurface representations that model small-scale continuous layers and maintain physically plausible continuities of the subsurface representations (e.g., computational stratigraphy model representations), while jointly honoring conditioning characteristics. Layer space may enable use of modeling that handle both continuous and discrete variables. Performing modeling within the layer space may enable simulation of both subsurface structures and properties. Simulation of subsurface configurations within the layer space may enable simulation of both continuous and discrete properties, overcoming the deficiencies of existing multi-point statistics techniques that are limited to discrete properties. Simulation of the subsurface structures and the properties may be performed concurrently to avoid correlation issues. For example, geostatistical modeling of petrophysical properties may be performed concurrently with structure generation. Such geostatistical modeling may require use of a multivariate geostatistical algorithm, such as the algorithm disclosed herein. Algorithms that perform subsurface structure and properties simulation sequentially may not be able to properly maintain property-structure correlations.

In some implementations, the modeling may be performed using one or more multi-point statistics techniques and/or other techniques. A multi-point statistics technique may refer to a facies modeling technique based on multiple-point statistics. A multi-point statistics technique may enable modeling of complex and heterogeneous subsurface configurations through use of one or more training images, which describe subsurface characteristics of the facies to model. In some implementations, one or more computational stratigraphy model representations/one or more sets of computational stratigraphy model representations may be used as a set of training images in the multi-point statistics technique. A multi-point statistics technique performed within the layer space may handle multivariate continuous variables. A multi-point statistics technique performed within the layer space may be based on fast Fourier transform and may be computationally efficient.

The subsurface representation(s) generated through modeling within the layer space may include regions of the subsurface configurations defined by the set(s) of subsurface representations (e.g., computational stratigraphy model representations). The regions of the subsurface configurations defined by the set(s) of subsurface representations may be included within the newly generated subsurface representation(s) based on the conditioning characteristic(s) and/or other information. Regions of the subsurface configurations defined by the set(s) of subsurface representations may refer to areas or portions of the subsurface configurations defined by one or more subsurface representations within the set(s)

of subsurface representations. Modeling may be used to identify regions of the subsurface configurations to be included within a subsurface representation based on one or more conditioning characteristics. Regions of the subsurface configurations identified for inclusion within a subsurface representation may include subsurface configurations that honor (e.g., preserves, simulates) the conditioning characteristics within the subsurface representation.

In some implementations, performance of the modeling may include, for an individual subsurface representation, generation of a simulation domain to define one or more properties of interest and a cell thickness for individual cells. Generation of a simulation domain may include specifying a simulation domain of size. A simulation domain may include one or more simulation/computation grids on which the modeling is performed. The simulation domain may include a multivariate grid used to define individual properties of interest (e.g., reservoir properties) in addition to cell thickness. The simulation domain may be populated with the conditioning characteristic(s). The simulation domain may be populated at corresponding spatial locations with the conditioning characteristic(s). That is, the conditioning characteristics may be inserted into the simulation domain in their corresponding locations based on the locations of the conditioning characteristics in the layer space.

The simulation domain may be partitioned into tiles, with individual tiles having a core region and a peripheral region. The simulation domain may be partitioned into tiles of equal sizes. The tile size may need not be a factor of the simulation grid size. A core region may be included within a tile. A core region may refer to a core portion of a tile. A core region may include the portion of the tile that is to be filled based on conditioning characteristics within the core region and/or based on continuity with neighboring tiles (as determined through the peripheral region).

A peripheral region (peripheral envelope) may be included within a tile or located outside the tile. For example, a peripheral region may include one or more portions of the tile that surround the core region and extend to edges of the tile. As another example, a peripheral region may include one or more areas outside the tile that surround the edges of the tile. At least some of the peripherical region of an individual tile may overlap with the core region of one or more neighboring tiles. That is, individual tiles within the simulation domain may define a core region and a peripheral region that may overlap with neighboring tile(s). Individual tile's core region may be assigned a region of the simulation domain, while the peripheral region may coincide with the core region of one or more neighboring tiles.

The tiles may include a set of partially populated tiles and a set of unpopulated tiles. A partially populated tile may refer to a tile that includes/is populated with at least one of the conditioning characteristic(s). The set of partially populated tiles may include one or more partially populated tiles populated with at least one of the conditioning characteristic(s). An unpopulated tile may refer to a tile that does not include/is not populated with any conditioning characteristics. The set of unpopulated tiles may include one or more unpopulated tiles not populated with any of the conditioning characteristic(s).

Individual partially populated tiles may be filled based on partially populated tile matching regions of the subsurface configurations and/or other information. Partially populated tile matching regions may be determined based on matching with the conditioning characteristic(s) within the individual tiles and/or other information. The conditioning characteristic(s) within a tile may represent data points that need to be matched/is sought to be matched within the subsurface configurations of the computational stratigraphy model representations.

A partially populated tile matching region of the subsurface configurations may refer to a region of the subsurface configurations that matches the conditioning characteristic(s) within a partially populated tile. A region of the subsurface configurations may match the conditioning characteristic(s) within a partially populated tile based on the region of the subsurface configurations having the same or similar (within a threshold value) subsurface characteristic(s) as the conditioning characteristic(s) within the partially populated tile. The subsurface configurations of the subsurface representation(s) (e.g., computational stratigraphy model representation(s)) may be scanned to identify regions that matches the conditioning characteristic(s) within a partially populated tile.

Figure 6A:
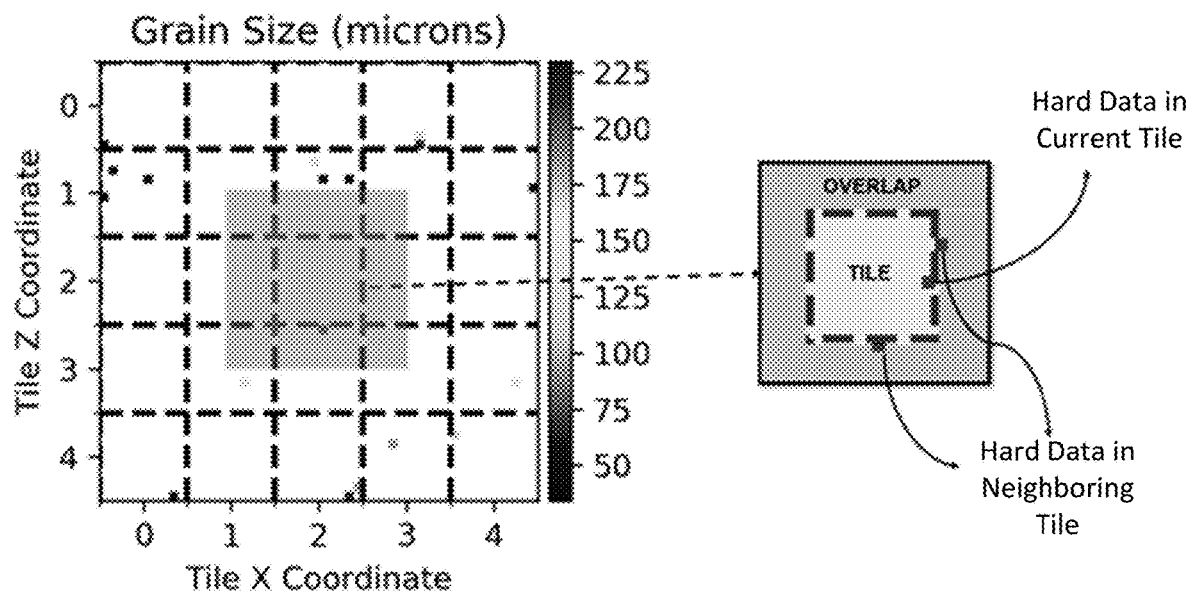
FIG. 6A illustrates example tiles within a simulation domain and example overlap regions.

The partially populated tile may be filed with and/or based on the partially populated tile matching regions of the subsurface configurations determined based on the conditioning characteristic(s) within the partially populated tile. FIG. 6A illustrates example tiles within a simulation domain and example overlap regions (peripheral region) when filling the center tile based on conditioning characteristics/hard data (grain size). Thus, the conditioning characteristic(s) (hard data) within a partially populated tile may be used to fill the partially populated tile with the region of the subsurface configurations that will honor the conditioning characteristic(s) within the partially populated tile. The region of the subsurface representation (e.g., computational stratigraphy model representation) with the matching region of the subsurface configurations may be extracted to fill the partially populated tile. The region of the subsurface representation with the matching region of the subsurface configurations may be used to fill the partially populated tile. In some implementations, region of the subsurface representation with the matching region of the subsurface configurations may be modified before being used to fill the partially populated tile.

In some implementations, filling of the partially populated tile with/based on the determined region of the subsurface configurations may include filling of the core region and the peripheral region of the partially populated tile. That is, both the core region and the peripheral region of the partially populated tile may be filled with/based on the tile matching region of the subsurface configurations. The peripheral region of the partially populated tile may be filled with/based on the corresponding portion of the determined region of the subsurface configurations.

In some implementations, filling of the partially populated tile with/based on the determined region of the subsurface configurations may include filling of the core region of the partially populated tile without filling of the peripheral region of the partially populated tile. That is, the peripheral region of the partially populated tile may not be filled with/based on the tile matching region of the subsurface configurations when filling the core region of the partially populated tile.

In some implementations, a partially populated tile may be filled further based on one or more neighboring tiles that have been previously filled. A neighboring tile of a tile may refer to an adjacent tile of the tile. A neighboring tile of a tile may share one or more edges of the tile. For example, in the two-dimensional space, a neighboring tile of a tile (e.g., square) may include tiles that are above, below, to the right, and/or to the left of the tile. As another example, in the three-dimensional space, a neighboring tile of a tile (e.g., cube) may include tiles that are above, below, to the right, to the left, in front of, behind, and/or diagonal to the tile. A neighboring tile of a tile may share one or more points of the tile. For example, in the two-dimensional space, a neighboring tile of a tile may include tiles that are above, below, to the right, to the left, and/or at corner/diagonal to the tile. As another example, in the three-dimensional space, a neighboring tile of a tile may include tiles that are above, below, to the right, to the left, in front of, behind, at upper-right front corner, at upper-right rear corner, at upper-left front corner, at upper-left rear corner, at lower-right front corner, at lower-right rear corner, at lower-left front corner, and/or at lower-left rear corner of the tile.

Filling a partially populated tile further based on previously filled neighboring tile(s) may include determining the partially populated tile matching region of the subsurface configurations further based on one or more portions of the filled neighboring tile(s). The partially populated tile region may be determined so that the subsurface characteristics of the partially populated tile region that overlaps with the previously filled neighboring tile(s) has the same or similar (within a threshold value) subsurface characteristics as the overlapping portion of the previously filled neighboring tile(s). For example, a core region of a neighboring tile may have been previously filled, and the partially populated tile matching region of the subsurface configuration may be determined based on the prior filling of the neighboring tile's core region so that the peripheral region of the partially populated tile matching region (that overlaps with the neighboring tile's core region) has the same or similar (within a threshold value) subsurface characteristics as the overlapping portion of core region of the neighboring tile. As another example, a peripheral region of a neighboring tile may have been previously filled, and the partially populated tile matching region of the subsurface configuration may be determined based on the prior filling of the neighboring tile's peripheral region that overlaps with the tile being filled so that the core region of the partially populated tile matching region (that overlaps with the neighboring tile's peripheral region) has the same or similar (within a threshold value) subsurface characteristics as the overlapping portion of peripheral region of the neighboring tile.

Figure 6B:
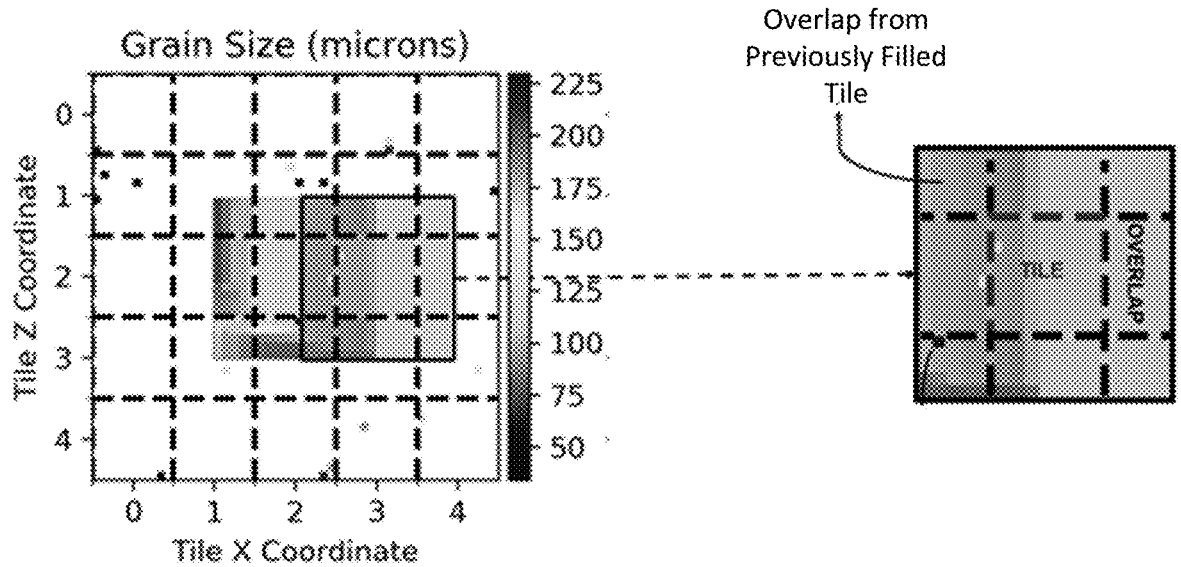
FIG. 6B illustrates example tiles within a simulation domain and example overlap regions.

Thus, filling of a partially populated tile may take into account both the conditioning characteristic(s) within the partially populated tile, as well as the overlap with the previously filled neighboring tile(s). FIG. 6B illustrates example tiles within a simulation domain and example overlap regions when filling in tiles that have a previously filled neighboring tile. Overlap regions within multiple previously filled neighboring tiles may be used to fill a partially populated tile. In some implementations, separate cross correlation maps may be computed for individual overlaps, and appropriate translations may be applied such that they coincide and then are stacked and summed.

Use of the overlap with previously filled tile(s) may enable generation of subsurface representations that maintains continuity of subsurface configurations within the simulation and/or continuity between neighboring tiles. Use of the overlap with previously filled tile(s) to fill a partially populated tile may effectuate/simulate use of a sliding window to fill the partially populated tile. In some implementations, subsurface characteristics within the overlapping portions of neighboring tiles may be modified to increase continuity between the tiles. For example, subsurface characteristics within the overlapping portions of neighboring tiles may be blended to minimize discontinuities between neighboring tiles. In some implementations, a boundary cutting technique may be used to maintain continuity of subsurface configurations within adjacent tiles. A boundary cutting technique may apply optimal boundary to minimize discontinuities between tiles. For example, between two adjacent tiles, a sampled tile's left overlap (matched overlap) may not match the previous tile's right target overlap. Optimal boundary may be applied to minimize the discontinuity, where content of the tile to the left of the boundary may be set to target overlap, and content of the tile to the right of the boundary may be matched overlap. Use of the overlap with previously filled tile(s) may enable generation of subsurface representations that maintain physically plausible continuities of the subsurface representations (e.g., computational stratigraphy model representations).

In some implementations, the partially populated tile matching regions may be determined further based on a continuity score between a search template in the layer space (comprised of conditioning data) and one or more subsurface representations (e.g., computational stratigraphy model representation(s), a set of computational stratigraphy model representations) in the layer space. A search template may refer to a set of points that are organized systematically and used for finding similar patterns in the subsurface representations (training images). For example, for individual partially populated tiles, a search template may be constructed for finding the (optimal) locations on the subsurface representations to extract the subsurface configurations. This may be composed of a binary matrix $I^{ijk}$ (where superscripts i j k denote the index of tile within simulation domain), which has a value (e.g., "1") where hard data is present and a set of matrices containing the hard data value of individual properties of interest: $S^{ijk} = \{I^{ijk}, V_1^{ijk}, V_2^{ijk}, \ldots, V_{n_p}^{ijk}\}$.

The continuity score between the search template and the subsurface representation (e.g., computational stratigraphy model representation) may be computed. This may be quantified using the (1) sum of square differences (SSD) and normalized cross correlation (NCC). For location $\vec{x}$ on the subsurface representation, the matching functions for tile property $V_p^{ijk}$ may be given as:

$$NCC(\vec{x})_p^{ijk} = \frac{\sum_{\vec{\tau} \in T} V_p^{ijk}[\vec{\tau}] V_p^{DA}[\vec{x}+\vec{\tau}] I^{ijk}[\vec{\tau}]}{\sqrt{\sum_{\vec{\tau} \in T} V_p^{DA}[\vec{x}+\vec{\tau}]^2 I^{ijk}[\vec{\tau}]} \sqrt{\sum_{\vec{\tau} \in T} V_p^{ijk}[\vec{\tau}]^2 I^{ijk}[\vec{\tau}]}}$$

$$SSD(\vec{x})_p^{ijk} = \sum_{\vec{\tau} \in T} (V_p^{ijk}[\vec{\tau}] - V_p^{DA}[\vec{x}+\vec{\tau}])^2 I^{ijk}[\vec{\tau}]$$

The continuity score at location $\vec{x}$ on the subsurface representation may be weighted sum of these two measures for individual properties of interest. The weight may be chosen to emphasis continuity for a property.

$$J^{ijk}(\vec{x}) = \sum_p^{n_p} w_p * \left(NCC(\vec{x})_p^{ijk} + SSD(\vec{x})_p^{ijk}\right)$$

Using the continuity score map $J^{ijk}(\vec{x})$, the following may be performed: (1) Hessian blob detection may be performed to identify regions of high match; (2) a weighted randomized sampling (weighed by maximum continuity cost map value in each blob) may be performed to select a single location $\vec{x}^*$; (3) the region of the subsurface representation that corresponds to the $\vec{x}^*$ denoted $S^{DA^*}$ may be extracted; (4) $S^{DA^*}$ may be compared to $S^{ijk}$ and patching blending may be performed to $S^{DA^*}$ (i.e. Gaussian blending) to ensure that they are consistent where $I^{ijk} \neq 0$. The blended $S^{DA^*}$ may be copied onto the simulation domain. This process (starting from construction of a search template) may be repeated until all partially populated tiles are filled.

Individual unpopulated tiles may be filled based on unpopulated tile matching regions of the subsurface configurations and/or other information. An unpopulated tile matching region may be determined based on continuity with one or more neighboring tiles and/or other information. Continuity with the neighboring tile(s) may be determined based on overlap between peripheral regions of neighboring tiles and core of the unpopulated tile. Overlaps between an unpopulated tile with neighboring tile(s) that have been previously filled may represent areas of data points that need to be matched using the subsurface configurations of the computational stratigraphy model representations.

An unpopulated tile matching region of the subsurface configurations may refer to a region of the subsurface configurations that matches the subsurface characteristic(s) within overlapping regions of neighboring tile(s). A region of the subsurface configurations may match the subsurface characteristic(s) within overlapping regions of neighboring tile(s) based on the region of the subsurface configurations having the same or similar (within a threshold value) subsurface characteristic(s) as the overlapping regions of neighboring tile(s). The subsurface configurations of the subsurface representation(s) (e.g., computational stratigraphy model representation(s)) may be scanned to identify regions that matches the subsurface characteristic(s) within overlapping regions of neighboring tile(s).

Figure 7:
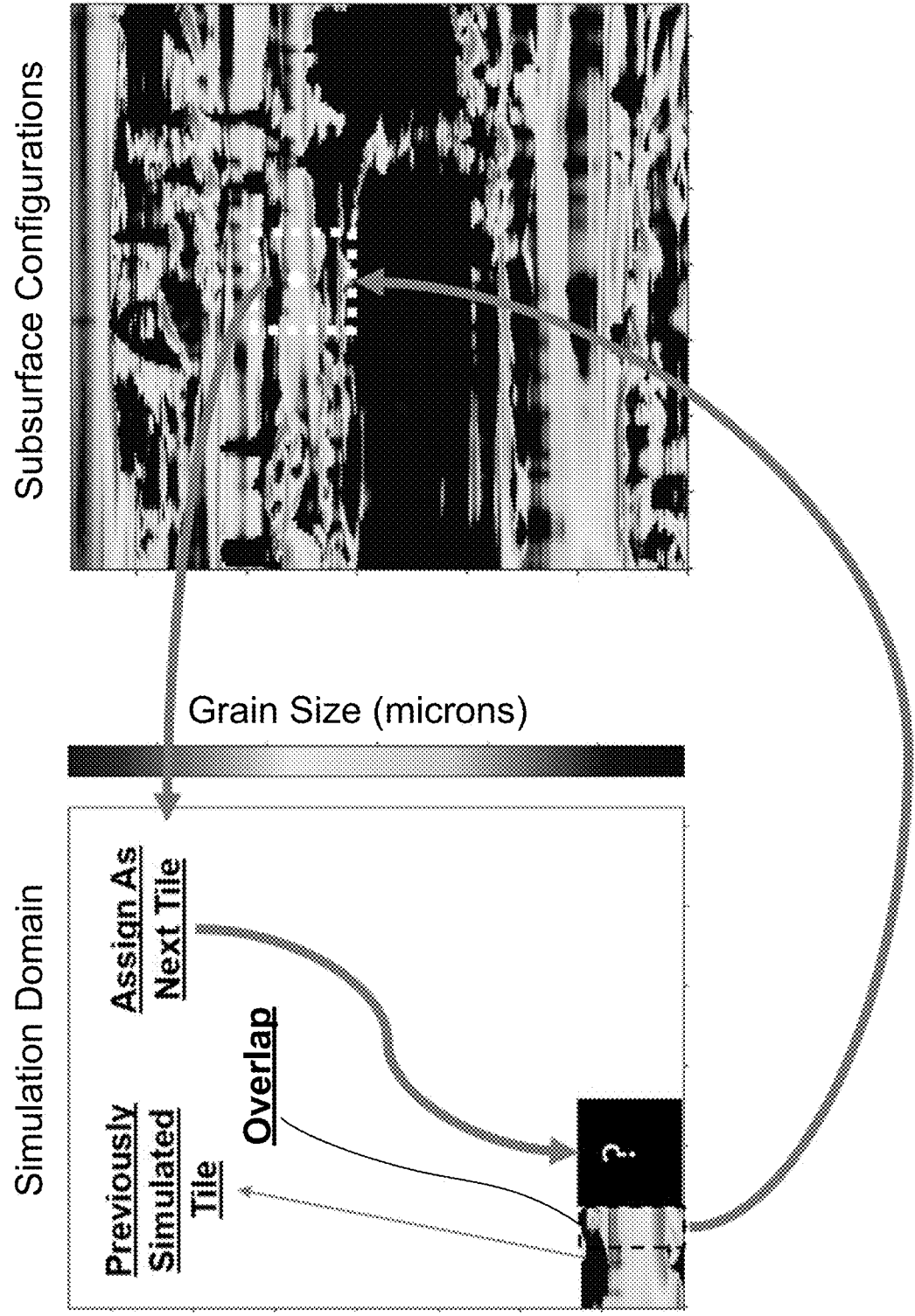
FIG. 7 illustrates an example insertion of a portion of subsurface configurations in the layer space into a simulation domain based on continuity with a previously filled neighboring tile.

The unpopulated tile may be filed with and/or based on the unpopulated tile matching regions of the subsurface configurations determined based on continuity with neighboring tile(s). FIG. 7 illustrates an example insertion of a portion of subsurface configurations in the layer space into a simulation domain based on continuity with a previously filled (simulated) neighboring tile. A portion of the subsurface configurations may be determined as an unpopulated tile matching region for assignment as the next (adjacent) tile based on the portion of the subsurface configurations being able to maintain continuity with the previously filled neighboring tile. Thus, the continuity of the tiles may be used to fill the unpopulated tile with the region of the subsurface configurations that will maintain physically plausible continuities of the subsurface representation (e.g., computational stratigraphy model representation). The region of the subsurface representation with the matching region of the subsurface configurations may be extracted to fill the unpopulated tile. The region of the subsurface representation with the matching region of the subsurface configurations may be used to fill the unpopulated tile. In some implementations, region of the subsurface representation with the matching region of the subsurface configurations may be modified before being used to fill the unpopulated tile.

While the examples shown in FIG. 6A, FIG. 6B, and FIG. 7 are in two-dimensions, this is merely as an example and is not meant to be limiting. The simulation domain may be partitioned into two-dimensional and/or three-dimensional tiles, and tile matching/filling may be performed in two-dimensions and/or three-dimensions.

In some implementations, individual partially populated tiles (tiles partially filled with conditioning characteristic(s)) may be filled prior to filling of individual unpopulated tiles (tiles with no data). That is, partially populated tiles may be prioritized in filling order so that they are filled with matching regions of the subsurface configurations prior to filling of unpopulated tiles. Such filling of tiles may prioritize conditioning characteristics within the simulation domain in generating subsurface representations.

An order in which the individual unpopulated tiles are filled may be determined based on a raster path and/or other information. The raster path may prioritize in the order the unpopulated tiles adjacent to one or more of the populated tiles (tiles that have been filled and have peripheral data that surrounding unpopulated tiles must take into account) over the unpopulated tiles not adjacent to any of the populated tiles. Such filing of tiles may prioritize regions near conditioning characteristics within the simulation domain in generating subsurface representations.

In some implementations, one or more morphological dilations may be applied to the simulation domain, where tiles filled in previous step (those containing conditioning characteristic(s)) are 1 and empty tiles are 0. The morphological structuring element may be a cube (e.g., 3×3 cube). Individual empty tiles that are dilated may be stored into a list (the raster path). This process may be repeated until the dilation covers the entire simulation domain.

The rather path may contain the order in which unpopulated tiles should be filled to ensure that unpopulated tiles surrounding conditioning characteristics are filled prior to other unpopulated tiles. For individual tiles in the raster path, the following may be performed: (1) The search template $S^{ijk} = \{1^{ijk}, V_1^{ijk}, V_2^{ijk}, \ldots, V_{n_p}^{ijk}\}$ may be constructed. This may be similar to the construction of the search template for populated tiles, except $I^{ijk}$ may now contain regions of the current tile that have already been filled in neighboring tiles; (2) the continuity score map $I^{ijk}(\vec{x})$ may be computed, as described above. $J^{ijk}(\vec{x})$ may be used and a single location $\vec{x}^*$ may be sampled as describe above, and $S^{DA^*}$ may be extracted; (3) $S^{DA^*}$ may be compared to $S^{ijk}$, and the (optimal) boundary cut within $I^{ijk} \neq 0$ may be found that would allow the two tiles to be stitched together while maximizing continuity. In some implementations, this may be accomplished by using one or more shortest path algorithms, such as Dijkstra's algorithm, on the $|S^{DA^*} - S^{ijk}|_2$ to find the lowest cost path. $S^{DA^*}$ and $S^{ijk}$ may be stitched along this (optimal) path and copied onto simulation domain. This process may be repeated until all unpopulated tiles in the raster path have been filled and the subsurface representation is generated.

Figure 8A:
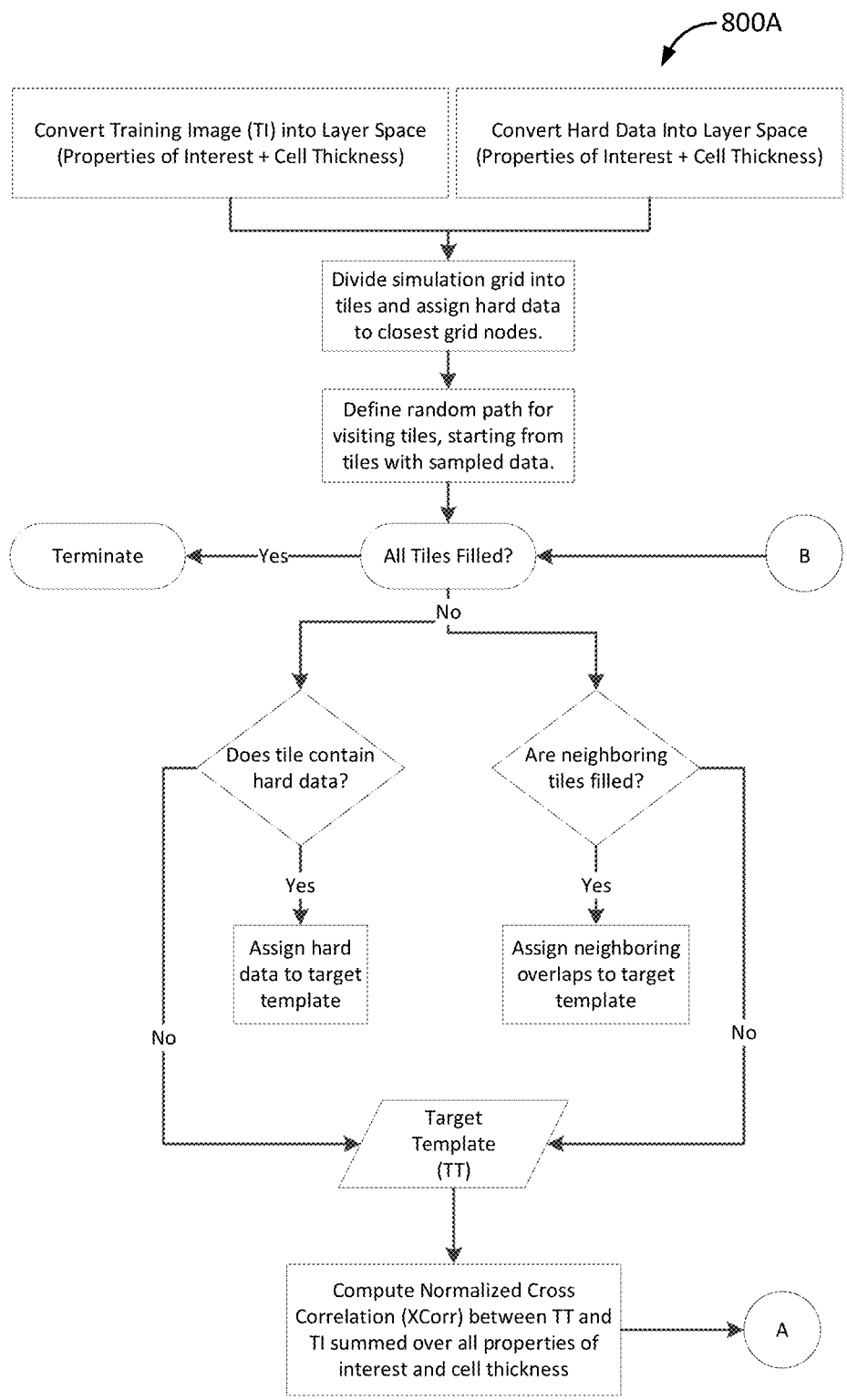
FIGS. 8A and 8B illustrate an example flow diagram including steps to generate subsurface representations within the layer space.
Figure 8B:
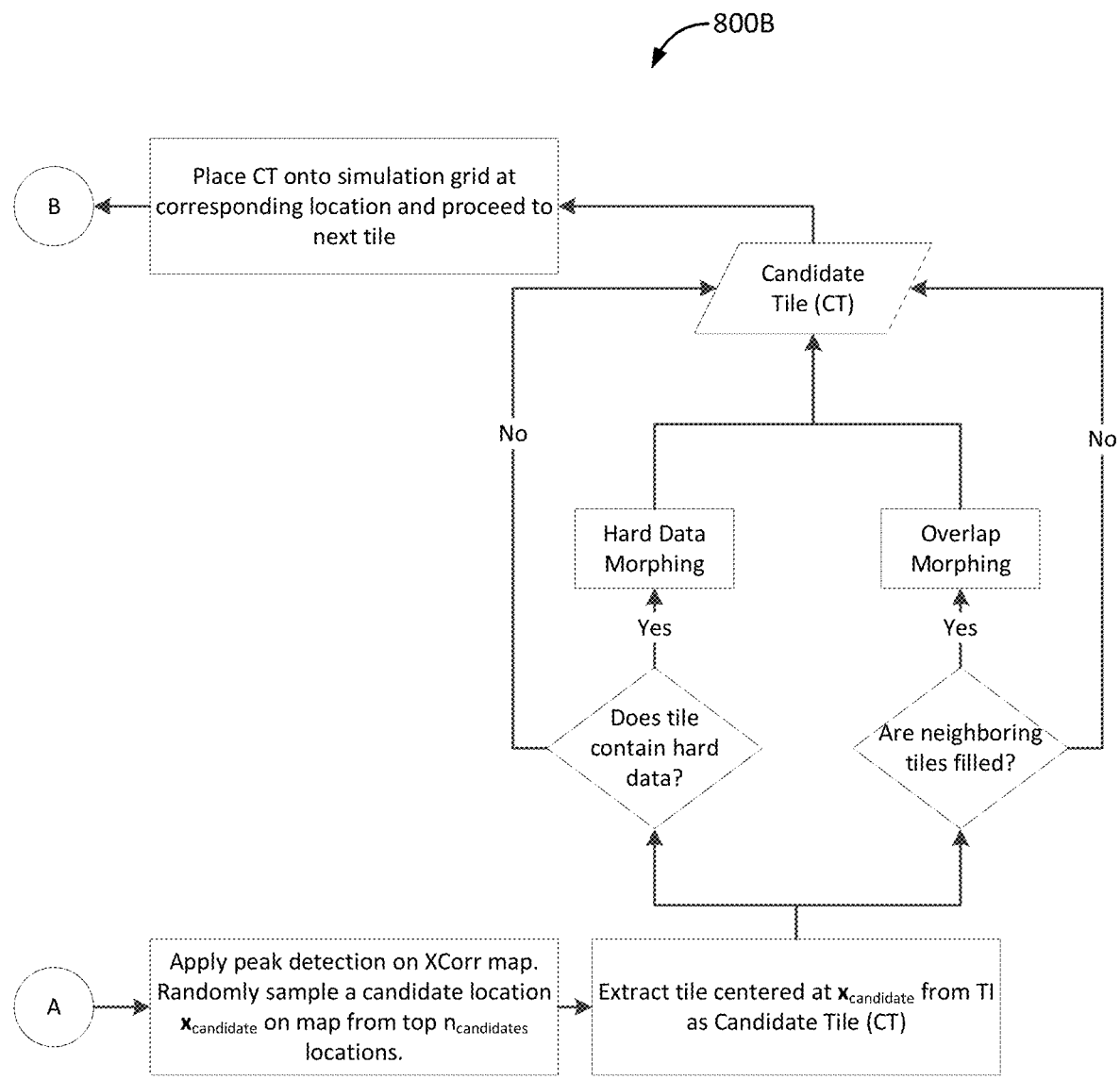

The above steps (starting from construction of search templates for populated tiles) may be repeated to generate additional subsurface representations. FIGS. 8A and 8B illustrate an example flow diagram (split into parts 800A, 800B) including steps to generate subsurface representations within the layer space.

Random sampling of tiles from locations with high correlations may enable generation of multiple subsurface representations. If only locations with maximum correlations are sampled for insertion in the simulation domain, different subsurface representations may contain only small differences. This may be due to the subsurface representations being generated from entire chunks of computational stratigraphy model representation being inserted into the simulation domain. Random sampling of tiles from locations with high correlations may be used to create variability between different subsurface representations.

The physical space component 110 may be configured to convert the subsurface representation(s) from the layer space to the physical space. The subsurface representation(s) may be back-transformed to the physical space. The subsurface representations in the layer space may define subsurface data (e.g., subsurface configurations) as a function of layers (and lateral spatial location), and conversion of the subsurface representation(s) into the physical space may result in the subsurface representation(s) defining subsurface data as a function of depth (and lateral spatial location). Conversion of the subsurface representation(s) from the layer space to the physical space may result in the subsurface representation(s) simulating how the subsurface region would appear in the real world.

In some implementations, a subsurface representation may be converted from the layer space to the physical space based on cell thicknesses, propert(ies) of interest, and/or other information. For example, a subsurface representation may be converted from the layer space to the physical space by taking the cumulative sum of the cell thicknesses in the z-direction and populating individual cells with the simulated propert(ies) of interest (e.g., simulated reservoir property). The subsurface representation(s) generated as described herein in the layer space and converted into the physical space may model small-scale continuous layers and maintain physically plausible continuities of the set(s) of computational stratigraphy model representations, while jointly honoring the conditioning characteristic(s).

Figure 9:
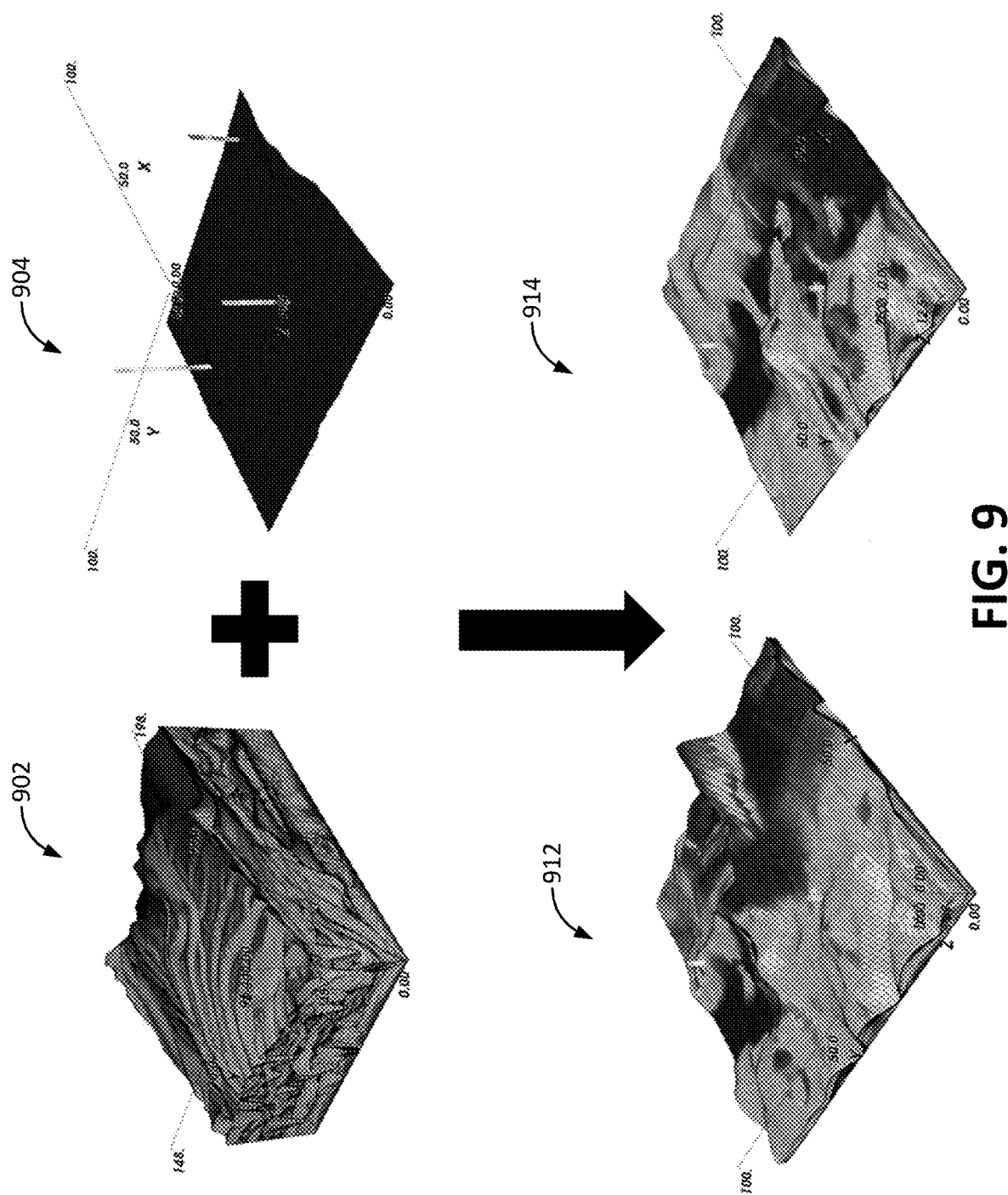
FIG. 9 illustrates example inputs and outputs of a subsurface representation generation algorithm.

FIG. 9 illustrates example inputs and outputs of the subsurface representation generation algorithm as disclosed herein. The inputs to the subsurface representation generation algorithm may include a computational stratigraphy model representation 902 and conditioning data 904. The conditioning data 904 may include subsurface data for three separate wells. Use of other number of wells are contemplated. The computational stratigraphy model representation 902 (three-dimensional training image) may provide rich digital analogs of depositional environments, and one or more subsurface representations that preserves the conditioning data 904 in their corresponding locations may be generated. For example, in FIG. 9, two separate subsurface representations 912, 914 may be generated from the computational stratigraphy model representation 902 and the conditioning data 904. The simulation grid may be half of the size of the training image.

Figure 10:
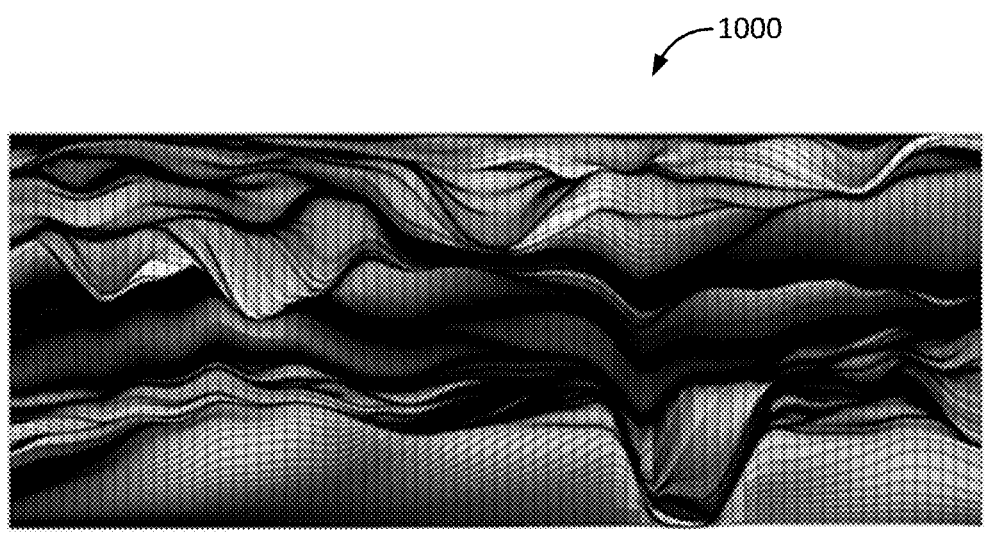
FIG. 10 illustrates an example two-dimensional image of a computational stratigraphy model representation.
Figure 11:
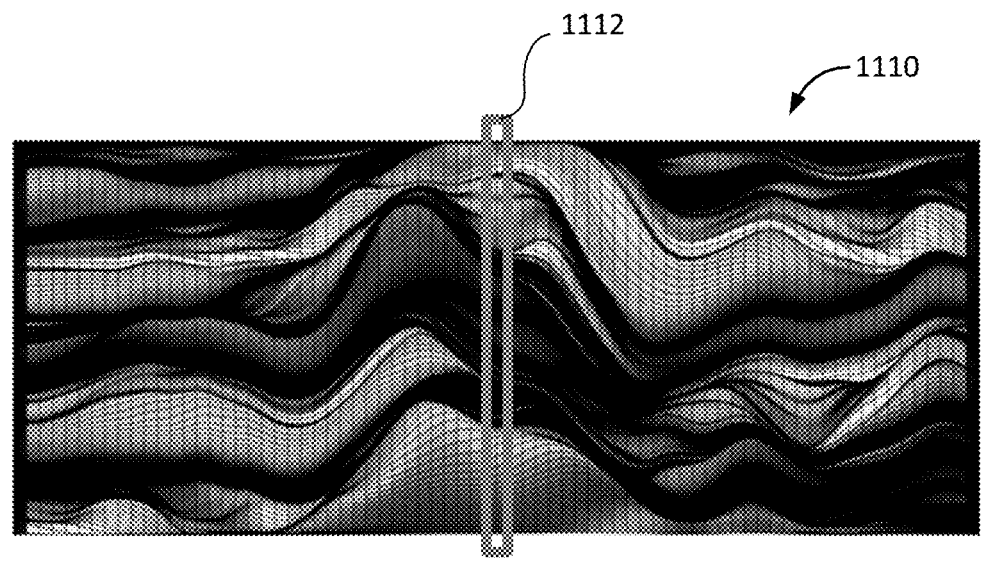
FIG. 11 illustrates example two-dimensional subsurface representations generated from the two-dimensional image shown in FIG. 10.
Figure 11:
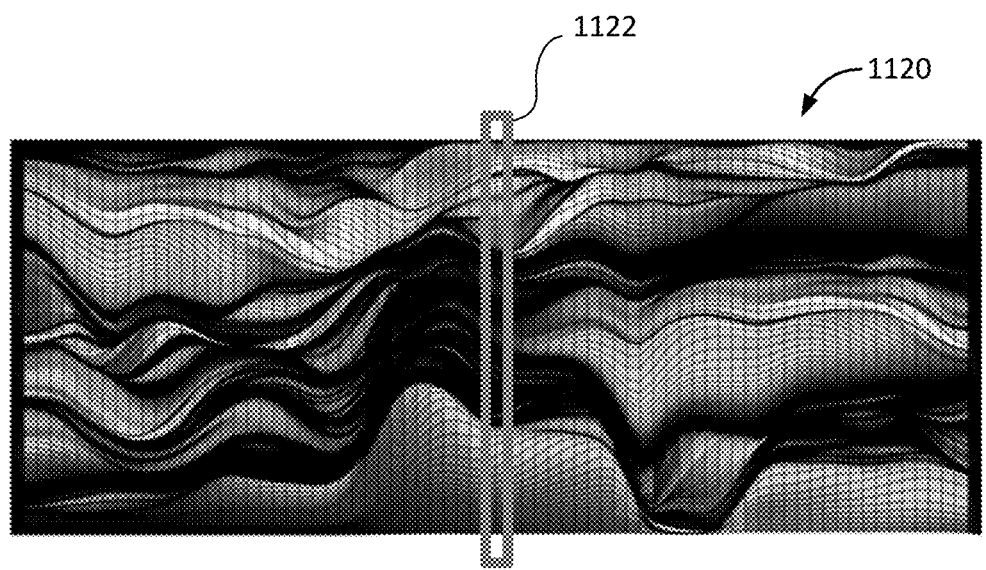

FIG. 10 illustrates an example two-dimensional image 1000 (e.g., cross-sectional image) of a computational stratigraphy model representation. The two-dimensional image 1000 may be used as a training image for modeling. FIG. 11 illustrate two separate two-dimensional subsurface representations 1110, 1120 generated from the two-dimensional image 1000. The two-dimensional subsurface representations 1110, 1120 may include two-dimensional slices of three-dimensional subsurface representations generated from the computational stratigraphy model representation. Areas 1112, 1122 of the two-dimensional subsurface representations 1110, 1120 may include/preserve conditioning data. As shown in FIG. 11, the conditioning data may be included/preserved within the areas 1112, 1122 of the subsurface representations 1110, 1120. Other areas of the subsurface representations 1110, 1120 may differ from each other. The variations in different subsurface representations may capture different possibilities of structural configurations.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11 and the electronic storage 13 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11 is shown in FIG. 1 as a single entity, this is for illustrative purposes only. In some implementations, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
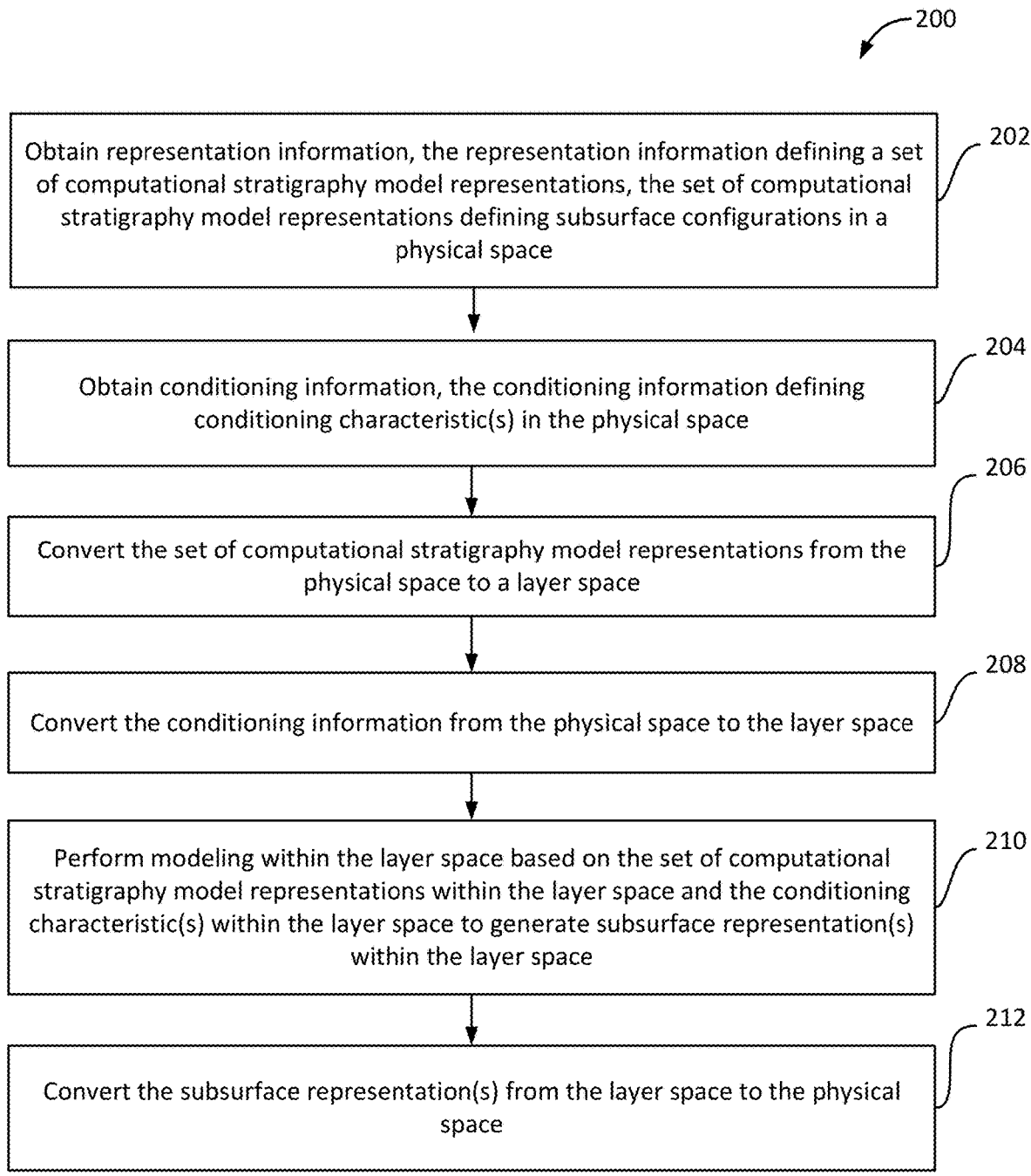
FIG. 2 illustrates an example method for generating subsurface representations.

FIG. 2 illustrates method 200 for generating subsurface representations. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, At operation 202, representation information may be obtained. The representation information may define a set of computational stratigraphy model representations. The set of computational stratigraphy model representations may define subsurface configurations in a physical space such that the subsurface configurations are defined as a function of depth. In some implementation, operation 202 may be performed by a processor component the same as or similar to the representation information component 102 (Shown in FIG. 1 and described herein).

At operation 204, conditioning information may be obtained. The conditioning information may define one or more conditioning characteristics in the physical space such that the conditioning characteristic(s) are defined as the function of depth. In some implementation, operation 204 may be performed by a processor component the same as or similar to the conditioning information component 104 (Shown in FIG. 1 and described herein).

At operation 206, the set of computational stratigraphy model representations may be converted from the physical space to a layer space such that the subsurface configurations are defined as a function of layers. In some implementation, operation 206 may be performed by a processor component the same as or similar to the layer space component 106 (Shown in FIG. 1 and described herein).

At operation 208, the conditioning information may be converted from the physical space to the layer space such that the conditioning characteristic(s) are defined as the function of layers. In some implementation, operation 208 may be performed by a processor component the same as or similar to the layer space component 106 (Shown in FIG. 1 and described herein).

At operation 210, modeling may be performed within the layer space based on the set of computational stratigraphy model representations within the layer space, the conditioning characteristic(s) within the layer space, and/or other information to generate one or more subsurface representations within the layer space. The subsurface representation(s) may include regions of the subsurface configurations based on the conditioning characteristic(s) and/or other information. In some implementation, operation 210 may be performed by a processor component the same as or similar to the modeling component 108 (Shown in FIG. 1 and described herein).

At operation 212, the subsurface representation(s) may be converted from the layer space to the physical space. In some implementation, operation 212 may be performed by a processor component the same as or similar to the physical space component 110 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for generating representations of subsurface, the system comprising: one or more physical processors configured by machine-readable instructions to:

obtain representation information, the representation information defining a set of computational stratigraphy model representations, the set of computational stratigraphy model representations defining subsurface configurations in a physical space such that the subsurface configurations are defined as a function of depth, wherein the set of computational stratigraphy model representations are generated layer-by-layer using a forward stratigraphic model that simulates one or more sedimentary processes;

obtain conditioning information, the conditioning information defining one or more conditioning characteristics in the physical space such that the one or more conditioning characteristics are defined as the function of depth;

convert the set of computational stratigraphy model representations from the physical space to a layer space such that the subsurface configurations are defined as a function of layers, wherein the set of computational stratigraphy model representations are converted from the physical space to the layer space based on the layer-by-layer generation of the set of computational stratigraphy model representations by the forward stratigraphic model;

convert the conditioning information from the physical space to the layer space such that the one or more conditioning characteristics are defined as the function of layers;

perform modeling within the layer space based on the set of computational stratigraphy model representations within the layer space and the one or more conditioning characteristics within the layer space to generate multiple subsurface representations within the layer space, the multiple subsurface representations including regions of the subsurface configurations defined by the set of computational stratigraphy model representations based on the one or more conditioning characteristics, wherein the performance of the modeling within the layer space includes simultaneous simulation of both subsurface structures and subsurface properties using the regions of the subsurface configurations defined by the set of computational stratigraphy model representations, the multiple subsurface representations generated to include different subsurface structures and subsurface properties such that the multiple subsurface representations define different subsurface configurations; and convert the multiple subsurface representations from the layer space to the physical space.

2. The system of claim 1, wherein the modeling is performed using a multi-point statistics technique.

3. The system of claim 2, wherein the set of computational stratigraphy model representations is used as a set of training images in the multi-point statistics technique.

4. The system of claim 1, wherein the one or more conditioning characteristics are determined based on one or more well logs and/or interpreted seismic information.

5. The system of claim 1, wherein the set of computational stratigraphy model representations in the layer space defines the subsurface configurations using cells within individual computational stratigraphy model grid layers, the cells characterized by a cell thickness and/or by one or more properties of interest.

6. The system of claim 5, wherein the one or more properties of interest include a grain size, a grain type, a grain lithology, a porosity, and/or a permeability.

7. The system of claim 1, wherein performance of the modeling includes:
for an individual subsurface representation, generating a simulation domain to define one or more properties of interest and a cell thickness for individual cells;
populating the simulation domain with the one or more conditioning characteristics;
partitioning the simulation domain into tiles, individual tiles having a core region and a peripheral region, wherein at least some of the peripherical region of an individual tile overlaps with the core region of a neighboring tile, further wherein the tiles include a set of partially populated tiles and a set of unpopulated tiles, the set of partially populated tiles including one or more partially populated tiles populated with at least one of the one or more conditioning characteristics and the set of unpopulated tiles including one or more unpopulated tiles not populated with any of the one or more conditioning characteristics;
filling individual partially populated tiles based on partially populated tile matching regions of the subsurface configurations, the partially populated tile matching regions determined based on matching with the one or more conditioning characteristics within the individual partially populated tiles; and
filling individual unpopulated tiles based on unpopulated tile matching regions of the subsurface configurations, the unpopulated tile matching regions determined based on continuity with one or more neighboring tiles;
wherein the individual partially populated tiles are filled prior to filling of the individual unpopulated tiles.

8. The system of claim 7, wherein the partially populated tile matching regions are determined further based on a continuity score between a search template in the layer space and a computational stratigraphy model representation in the layer space, the continuity score computed as a weighted sum of normalized cross correlation (NCC) and sum of square differences (SSD) for individual properties of interest.

9. The system of claim 7, wherein an order in which the individual unpopulated tiles are filled is determined based on a raster path, the raster path prioritizing in the order the unpopulated tiles adjacent to one or more of populated tiles over the unpopulated tiles not adjacent to any of the populated tiles.

10. The system of claim 1, wherein the multiple subsurface representations model small-scale continuous layers and maintain physically plausible continuities of the set of computational stratigraphy model representations, while jointly honoring the one or more conditioning characteristics.

11. A method for generating representations of subsurface, the method comprising:
obtaining representation information, the representation information defining a set of computational stratigraphy model representations, the set of computational stratigraphy model representations defining subsurface configurations in a physical space such that the subsurface configurations are defined as a function of depth, wherein the set of computational stratigraphy model representations are generated layer-by-layer using a forward stratigraphic model that simulates one or more sedimentary processes;
obtaining conditioning information, the conditioning information defining one or more conditioning characteristics in the physical space such that the one or more conditioning characteristics are defined as the function of depth;

converting the set of computational stratigraphy model representations from the physical space to a layer space such that the subsurface configurations are defined as a function of layers, wherein the set of computational stratigraphy model representations are converted from the physical space to the layer space based on the layer-by-layer generation of the set of computational stratigraphy model representations by the forward stratigraphic model;

converting the conditioning information from the physical space to the layer space such that the one or more conditioning characteristics are defined as the function of layers;

performing modeling within the layer space based on the set of computational stratigraphy model representations within the layer space and the one or more conditioning characteristics within the layer space to generate multiple subsurface representations within the layer space, the multiple subsurface representations including regions of the subsurface configurations defined by the set of computational stratigraphy model representations based on the one or more conditioning characteristics, wherein the performance of the modeling within the layer space includes simultaneous simulation of both subsurface structures and subsurface properties using the regions of the subsurface configurations defined by the set of computational stratigraphy model representations, the multiple subsurface representations generated to include different subsurface structures and subsurface properties such that the multiple subsurface representations define different subsurface configurations; and converting the multiple subsurface representations from the layer space to the physical space.

12. The method of claim 11, wherein the modeling is performed using a multi-point statistics technique.

13. The method of claim 12, wherein the set of computational stratigraphy model representations is used as a set of training images in the multi-point statistics technique.

14. The method of claim 11, wherein the one or more conditioning characteristics are determined based on one or more well logs and/or interpreted seismic information.

15. The method of claim 11, wherein the set of computational stratigraphy model representations in the layer space defines the subsurface configurations using cells within individual computational stratigraphy model grid layers, the cells characterized by a cell thickness and/or by one or more properties of interest.

16. The method of claim 15, wherein the one or more properties of interest include a grain size, a grain type, a grain lithology, a porosity, and/or a permeability.

17. The method of claim 11, wherein performance of the modeling includes:

for an individual subsurface representation, generating a simulation domain to define one or more properties of interest and a cell thickness for individual cells;

populating the simulation domain with the one or more conditioning characteristics;

partitioning the simulation domain into tiles, individual tiles having a core region and a peripheral region, wherein at least some of the peripherical region of an individual tile overlaps with the core region of a neighboring tile, further wherein the tiles include a set of partially populated tiles and a set of unpopulated tiles, the set of partially populated tiles including one or more partially populated tiles populated with at least one of the one or more conditioning characteristics and the set of unpopulated tiles including one or more unpopulated tiles not populated with any of the one or more conditioning characteristics;

filling individual partially populated tiles based on partially populated tile matching regions of the subsurface configurations, the partially populated tile matching regions determined based on matching with the one or more conditioning characteristics within the individual partially populated tiles; and filling individual unpopulated tiles based on unpopulated tile matching regions of the subsurface configurations, the unpopulated tile matching regions determined based on continuity with one or more neighboring tiles;

wherein the individual partially populated tiles are filled prior to filling of the individual unpopulated tiles.

18. The method of claim 17, wherein the partially populated tile matching regions are determined further based on a continuity score between a search template in the layer space and a computational stratigraphy model representation in the layer space, the continuity score computed as a weighted sum of normalized cross correlation (NCC) and sum of square differences (SSD) for individual properties of interest.

19. The method of claim 17, wherein an order in which the individual unpopulated tiles are filled is determined based on a raster path, the raster path prioritizing in the order the unpopulated tiles adjacent to one or more of populated tiles over the unpopulated tiles not adjacent to any of the populated tiles.

20. The method of claim 11, wherein the one or more multiple subsurface representations model small-scale continuous layers and maintain physically plausible continuities of the set of computational stratigraphy model representations, while jointly honoring the one or more conditioning characteristics.

* * * * *

UNITED STATES PATENT AND TRADEMARK OFFICE
CERTIFICATE OF CORRECTION

PATENT NO. : 11,010,969 B1  
APPLICATION NO. : 16/706602  
DATED : May 18, 2021  
INVENTOR(S) : Lewis Li et al.

It is certified that error appears in the above-identified patent and that said Letters Patent is hereby corrected as shown below:

In the Claims

In Claim 20, Column 28, Line 47, please delete "one or more".

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*